(12) United States Patent
Reznic

(10) Patent No.: US 11,490,140 B2
(45) Date of Patent: Nov. 1, 2022

(54) SYSTEM, DEVICE, AND METHOD FOR ROBUST VIDEO TRANSMISSION UTILIZING USER DATAGRAM PROTOCOL (UDP)

(71) Applicant: Amimon Ltd., Ra'anana (IL)

(72) Inventor: Zvi Reznic, Tel Aviv (IL)

(73) Assignee: AMIMON LTD., Ra'anana (IL)

( * ) Notice: Subject to any disclaimer, the term of this patent is extended or adjusted under 35 U.S.C. 154(b) by 0 days.

(21) Appl. No.: 17/058,192

(22) PCT Filed: May 3, 2020

(86) PCT No.: PCT/IL2020/050490
§ 371 (c)(1),
(2) Date: Nov. 24, 2020

(87) PCT Pub. No.: WO2020/230118
PCT Pub. Date: Nov. 19, 2020

(65) Prior Publication Data
US 2022/0060767 A1 Feb. 24, 2022

Related U.S. Application Data

(60) Provisional application No. 62/846,669, filed on May 12, 2019, provisional application No. 62/949,516, filed on Dec. 18, 2019.

(51) Int. Cl.
*H04N 21/236* (2011.01)
*H04L 69/16* (2022.01)
(Continued)

(52) U.S. Cl.
CPC ..... *H04N 21/23605* (2013.01); *H04L 1/0061* (2013.01); *H04L 69/16* (2013.01); *H04N 21/64322* (2013.01)

(58) Field of Classification Search
CPC .......................... H04N 21/23605; H04L 69/16
See application file for complete search history.

(56) References Cited

U.S. PATENT DOCUMENTS

| 7,093,028 B1 * | 8/2006 | Shao | H04L 47/326 |
| | | | 709/236 |
| 8,102,878 B2 * | 1/2012 | Lee | H04L 1/0007 |
| | | | 370/468 |

(Continued)

FOREIGN PATENT DOCUMENTS

| EP | 0 996 291 A1 | 4/2000 |
| EP | 0 996 292 A1 | 4/2000 |

OTHER PUBLICATIONS

International Search Report in PCT/IL2020/050490, dated Sep. 21, 2020.
(Continued)

*Primary Examiner* — Suraj M Joshi
(74) *Attorney, Agent, or Firm* — Browdy and Neimark, PLLC

(57) ABSTRACT

System, device, and method for transmitting a video via a User Datagram Protocol (UDP) over Internet Protocol (IP) communication link. A method includes: generating by a video encoder a set of N packets of compressed data per each frame of the video, wherein N is a natural number; and upon generation of each set of N packets for a specific frame of that video, immediately performing the transmitting of the set of N packets that corresponds to a single encoded video frame, via that UDP over IP communication link, without waiting for encoding or packetization of any other video frame of that video. Each packet of that video frame includes at least: a Coarse video data packet-portion, and a Fine video data packet-portion, and optionally also a Header packet-portion that includes sub-frames mapping information.

29 Claims, 9 Drawing Sheets

(51) Int. Cl.
*H04L 1/00* (2006.01)
*H04N 21/643* (2011.01)

(56) References Cited

U.S. PATENT DOCUMENTS

| | | |
|---|---|---|
| 2002/0071485 A1 | 6/2002 | Caglar |
| 2006/0222203 A1 | 10/2006 | Mercier |
| 2008/0104659 A1 | 5/2008 | West |
| 2016/0073122 A1* | 3/2016 | Reznic .............. H04N 21/4382 |
| | | 375/240.12 |
| 2016/0283859 A1* | 9/2016 | Fenoglio ................ H04L 43/04 |
| 2018/0331880 A1* | 11/2018 | Wu ........................ H04L 65/65 |

OTHER PUBLICATIONS

Written Opinion of the International Searching Authority in PCT/IL2020/050490, dated Sep. 21, 2020.
European search report dated Jul. 1, 2022, from corresponding European application No. 20805315.7.

\* cited by examiner

Fig. 1

201 — Fine (1) | Fine (2) | Fine (3) | ... | Fine (M)

202 — Coarse (1) | Coarse (2) | Coarse (3) | ... | Coarse (M)

203 — Lc(1) | Lc(2) | Lc(3) | ... | Lc(M) | Lf(1) | Lf(2) | Lf(3) | ... | Lf(M)

Set of Vectors / Groups 200

*Fig. 2*

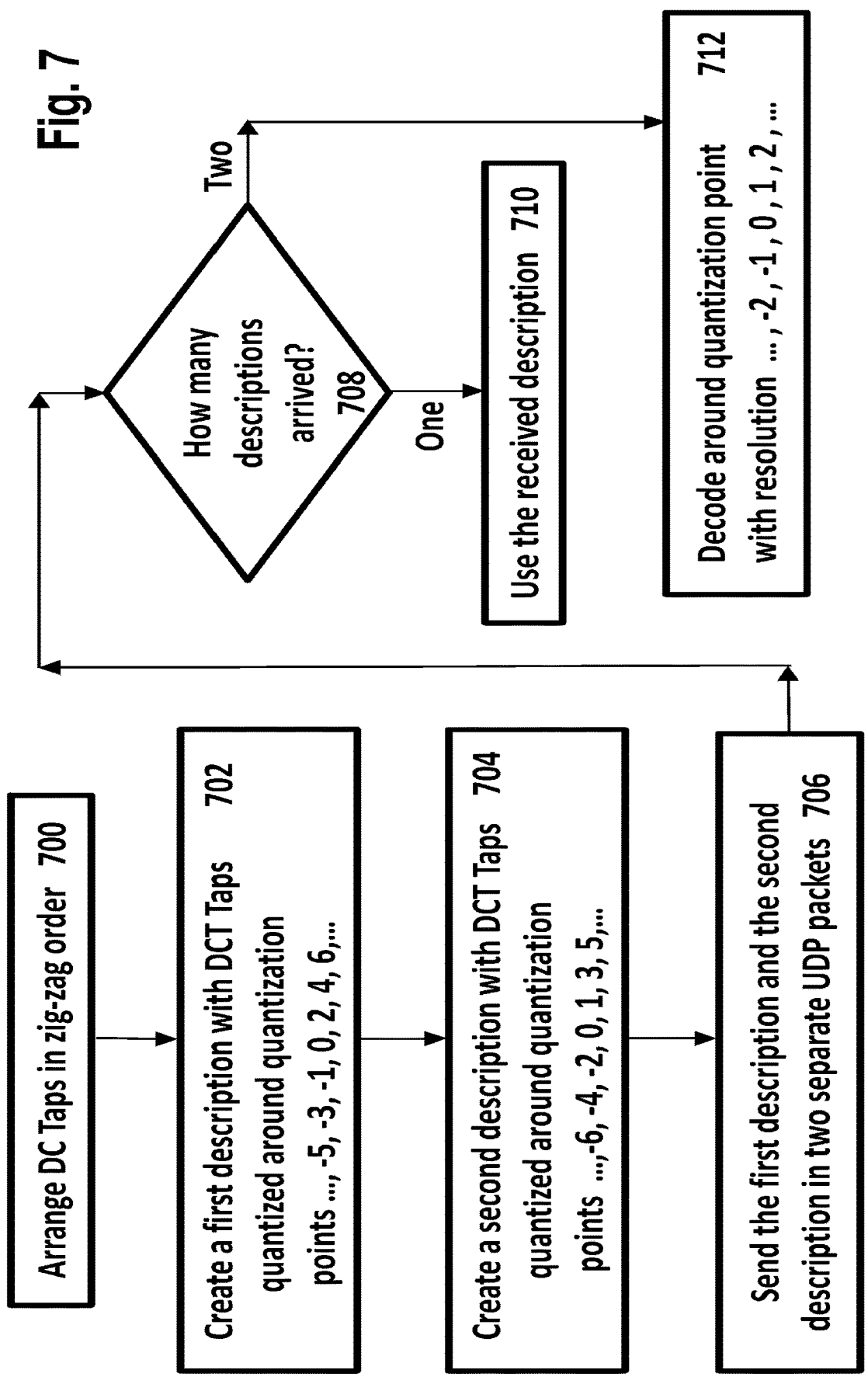

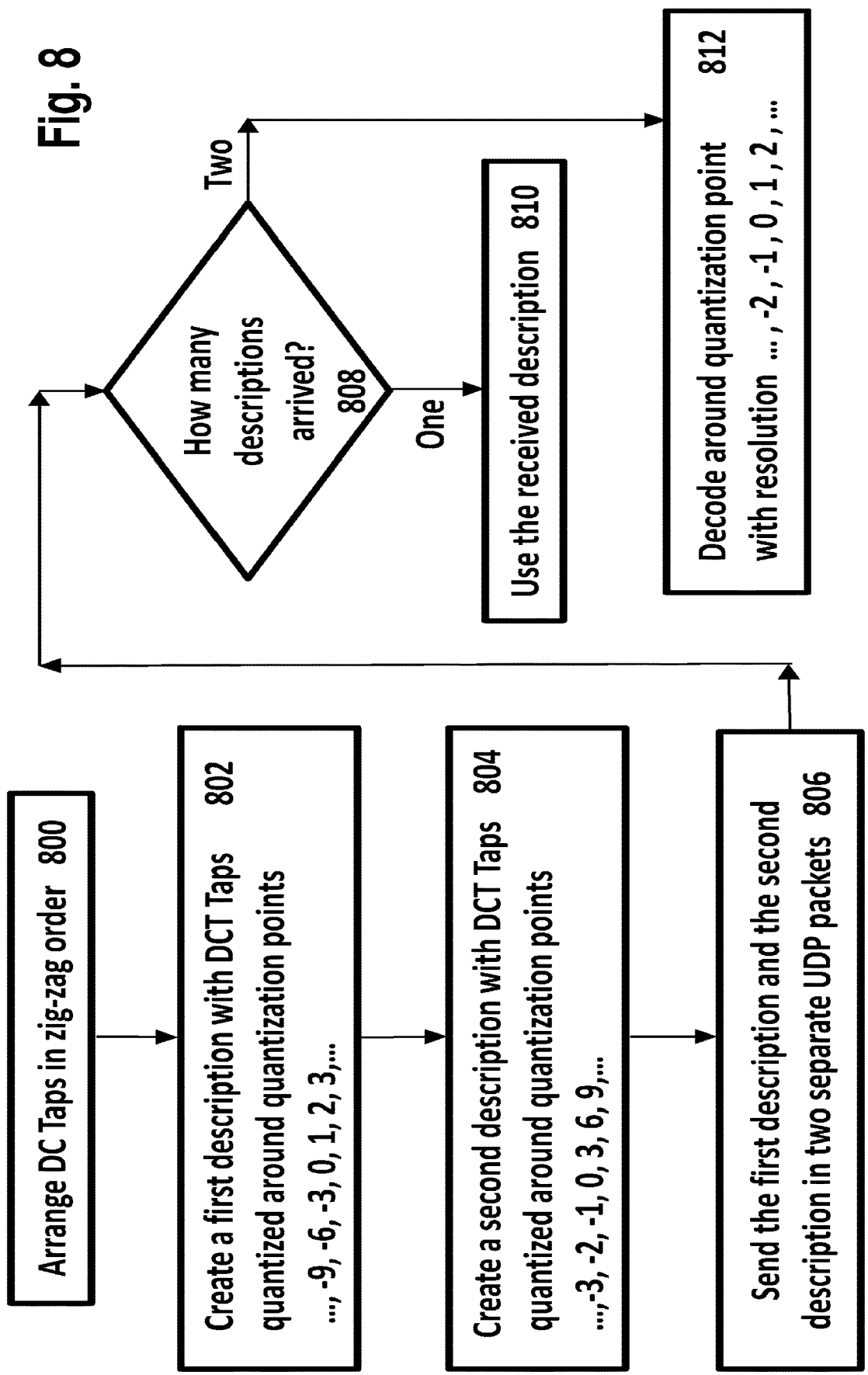

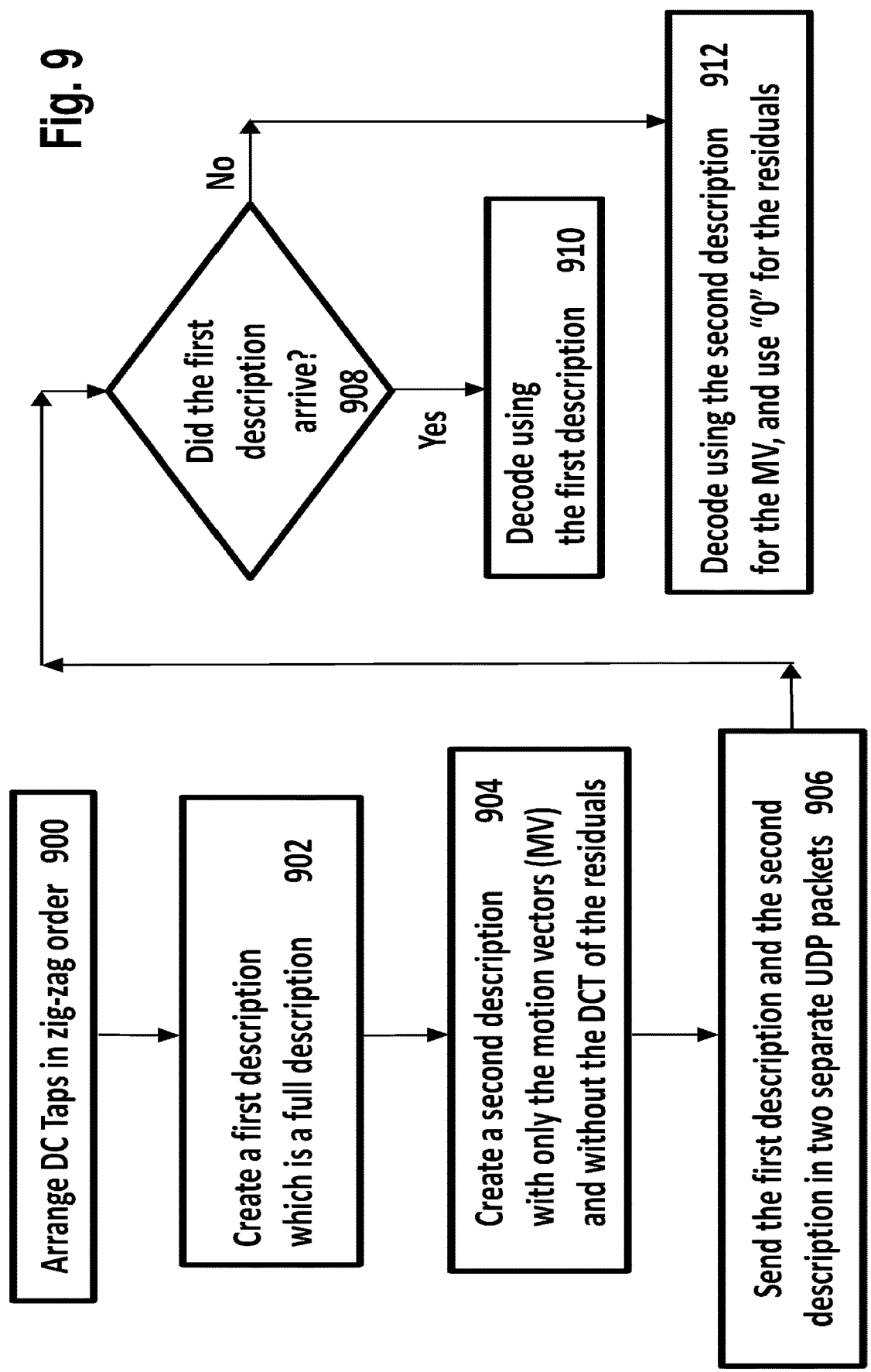

SYSTEM, DEVICE, AND METHOD FOR ROBUST VIDEO TRANSMISSION UTILIZING USER DATAGRAM PROTOCOL (UDP)

CROSS-REFERENCE TO RELATED APPLICATIONS

This patent application is a National Stage of PCT international application number PCT/IL2020/050490, having an international filing date of May 3, 2020, published as International Publication number WO 2020/230118 A1, which is hereby incorporated by reference in its entirety. The above-mentioned PCT/IL2020/050490 claims benefit and priority from U.S. 62/949,516, filed on Dec. 18, 2019, which is hereby incorporated by reference in its entirety; and from U.S. 62/846,669, filed on May 12, 2019, which is hereby incorporated by reference in its entirety.

FIELD

The present invention relates to the field of communication systems.

BACKGROUND

Electronic devices and computing devices are utilized on a daily basis by millions of users worldwide. For example, laptop computers, desktop computers, smartphone, tablets, and other electronic devices are utilized for browsing the Internet, consuming digital content, streaming audio and video, sending and receiving electronic mail (email) messages, Instant Messaging (IM), video conferences, playing games, or the like.

Many electronic devices communicate with each other, or with remote servers or remote entities, via one or more wireless communication links or networks; for example, using Wi-Fi, using cellular communications, over the Internet, or the like. Some electronic devices are utilized to receive wireless communications signals that carry video data, to allow such electronic devices to play a streaming video or a video clip on a display unit thereof.

SUMMARY

Some embodiments of the present invention may provide systems, devices, and methods for robust video transmission utilizing User Datagram Protocol (UDP). For example, a method includes: generating by a video encoder a set of N packets of compressed data per each frame of the video, wherein N is a natural number; and upon generation of each set of N packets for a specific frame of that video, immediately performing the transmitting of the set of N packets that corresponds to a single encoded video frame, via that UDP over IP communication link, without waiting for encoding or packetization of any other video frame of that video. Each packet of that video frame includes at least: a Coarse video data packet-portion, and a Fine video data packet-portion, and optionally also a Header packet-portion that includes sub-frames mapping information.

The present invention may provide other and/or additional advantages and/or benefits.

BRIEF DESCRIPTION OF THE DRAWINGS

FIG. 1 is a schematic illustration of a set of packets of H.265 video, intended for transmission via a UDP over IP connection, in accordance with some demonstrative embodiments of the present invention.

FIG. 2 is a schematic illustration demonstrating frame grouping, in accordance with some demonstrative embodiments of the present invention.

FIG. 7 is a flowchart of a method of performing small overhead concealment in video transmissions using UDP packets, in accordance with some demonstrative embodiments of the present invention.

FIG. 8 is a flowchart of a method of performing small overhead concealment in video transmissions using UDP packets, in accordance with some demonstrative embodiments of the present invention.

FIG. 9 is a flowchart of a method of performing small overhead concealment in video transmissions using UDP packets, in accordance with some demonstrative embodiments of the present invention.

DETAILED DESCRIPTION OF SOME DEMONSTRATIVE EMBODIMENTS

Figure 3:
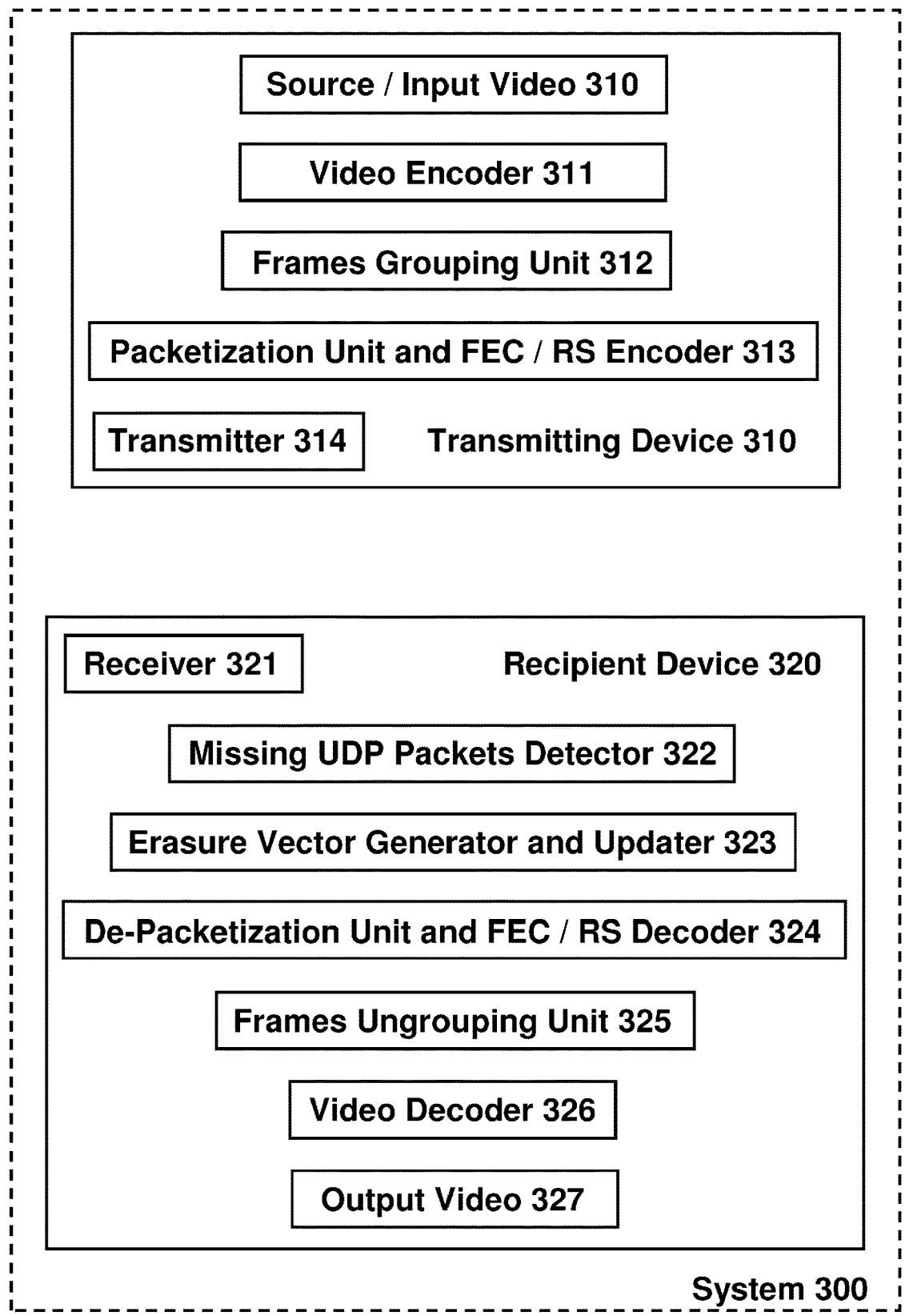
FIG. 3 is a schematic illustration of a system, in accordance with some demonstrative embodiments of the present invention.

Some embodiments of the present invention may enable transmission and reception of video, particularly video that is compressed or encoded with advanced compression standards such as High Efficiency Video Coding (HEVC) or H.265 or MPEG-H Part 2 video compression standard, or H.264 or MPEG-4 Part 10 or Advanced Video Coding (AVC or MPEG-4 AVC) video compression standard; and with regard to compressed video that is represented using Coarse data portions and Fine (or Refinement) data portions as described herein. Some embodiments of the present invention may be utilized in conjunction with video that is compressed or encoded in accordance with a Scalable Video Coding (SVC) technique, such as, using H.264 SVC or using the Annex G extension of the H.264/MPEG-4 AVC video compression standard; or by a similar technique in which a high-quality video stream is encoded into two or more subset bitstreams, wherein a subset bitstream may represent a version having lower spatial resolution (smaller screen) and/or a version having lower temporal resolution (lower frame-rate) and/or a version having lower quality or fidelity or Signal-to-Noise Ratio (SNR).

The terms "Fine" or "Fine data" or "Fine video data" or "Refinement" or "Refinement data" or "Refinement video data", or similar terms, are used herein interchangeably; such that "Fine" may also include or mean "Refinement", and such that "Refinement" may also include or mean "Fine". In some embodiments, "Fine" or "Refinement" video data may include data that enable a video decoder to add details to a Coarse version of a frame by having the Coarse video data and then adding details onto it or building upon it in order to create a higher quality version of the frame. In other embodiments, "Fine" or "Refinement" video data may include data that enable a video decoder to reconstruct "from scratch" a high-detail version of a video frame, without necessarily utilizing or relying upon the Coarse video data of that frame.

The Applicants have realized that there are two main options for sending compressed video over an Internet Protocol (IP) connection: via Transmission Control Protocol (TCP), or via User Datagram Protocol (UDP). The Applicants have further realized that in TCP transmission of compressed video, the transmission is more reliable, but suffers from higher latency; whereas, in UDP transmission of compressed video, the transmission is less reliable, but the latency or delays are lower. For example, realized the Applicants, a UDP packet usually either arrives to its intended recipient or does not arrive at all (e.g., rather than arriving as a malformed packet); and the recipient side or a video decoder thereof may be configured to determine that a UDP packet that should have been received has not been received. Embodiments of the present invention may operate to increase the reliability and/or robustness of video transmission over UDP.

For demonstrative purposes, some portions of the discussion herein may relate to H.265 video; however, this is only a non-limiting example, and embodiments of the present invention may be used in conjunction with other types of compressed video and/or encoded video. Embodiments of the present invention may be suitable for handling, transmission, and reception of video data that is characterized by having two or more portions: a Coarse portion, and a Fine (or Refinement) portion. For example, the Coarse portion may include a low level representation of each video frame, such that successful reception and decoding of the Coarse portion would enable the receiving entity to produce and display at least a Coarse representation of the frame or a low resolution version of the frame or a partially-detailed, which may lack high-resolution details but may still suffice for conveying to a viewer a sufficient amount of visual information that enables the viewer to understand the depicted content. The Fine portion or the Refinement portion may include data that enables the receiving entity to produce and display a high-resolution version or a full-resolution version of the frame or a fully-detailed version of the frame; in some embodiments, the Refinement portion may include, for example, data corresponding to the differences between the Coarse version of the frame (which is represented already in the Coarse portion of the data) and the actual, original, frame with the entirety of its details or with at least some additional details that are not represented in the Coarse data portion. In some embodiments, for example, the video may comprise Coarse portions and Refinement portions as described in United States patent application publication number US 2016/0073122 A1, titled "Wireless transmission of high-quality video", which is hereby incorporated by reference in its entirety.

Figure 4:
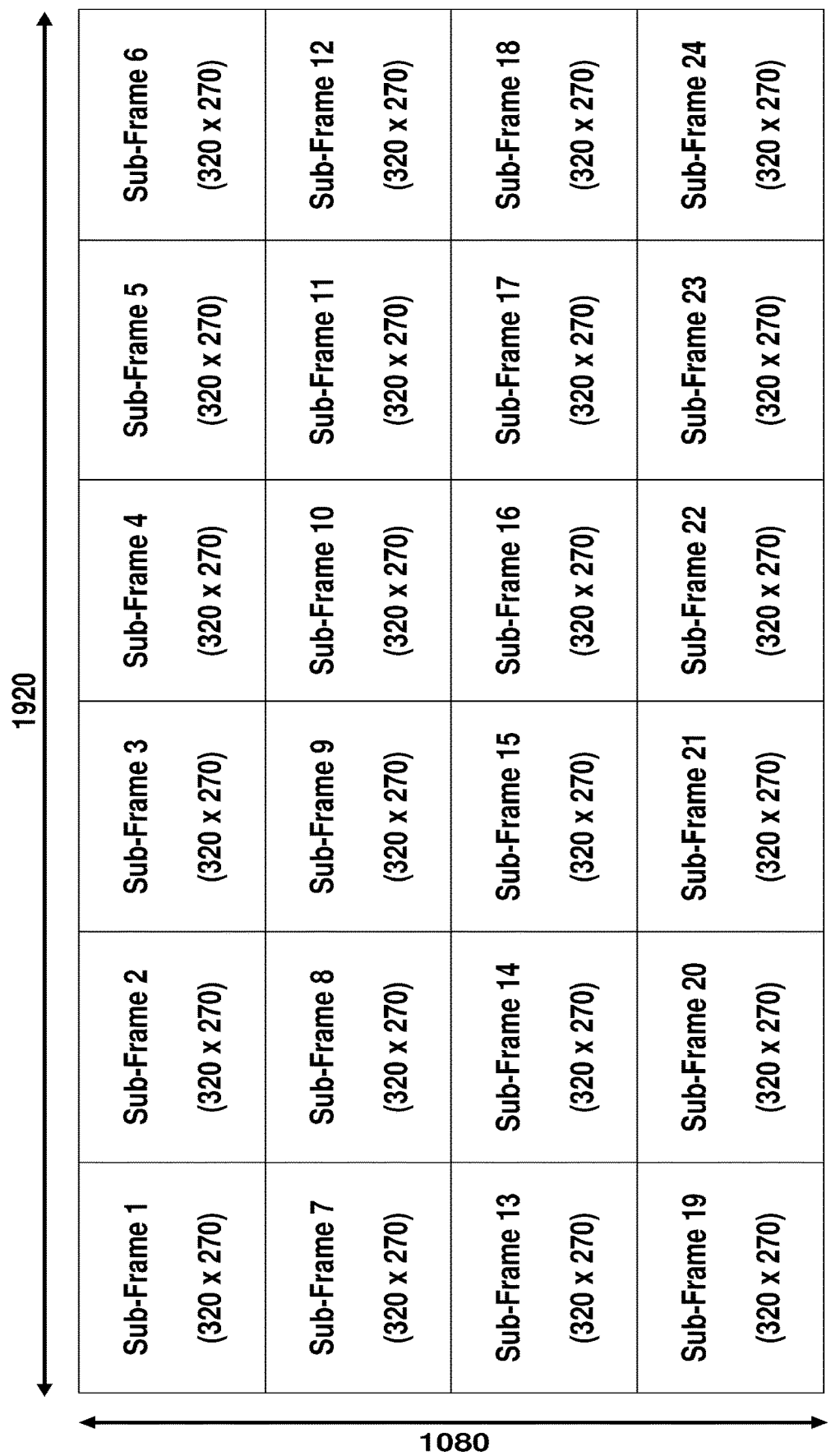
FIG. 4 is a schematic illustration of a video frame divided into sub-frames, in accordance with some demonstrative embodiments of the present invention.

Some embodiments may operate in conjunction with video having discrete frames, such that each frame is represented as (or is logically divided to) M sub-frames, wherein M is an integer greater than 1; such as, to 24 frames. Reference is made to FIG. 4, which is a schematic illustration of a video frame 400, having a total size (or dimensions) of 1920 pixels wide by 1080 pixels high. Frame 400 may be divided into 24 sub-frames, numbered from 1 to 24; arranged as a matrix or array of 6 rows by 4 columns; each such sub-frame corresponding to $\frac{1}{24}$ of the entire area of frame 400; each such sub-frame being 320 pixels wide by 270 pixels high. In some embodiments, the data representation for that frame 400 may comprise 24 data-portions, each data-portion corresponding to a sub-frame, in their consecutive running order; and such that each data-portion may comprise the Coarse video data for that sub-frame, followed by the Refinement video data for that sub-frame. In other embodiments, the Coarse data for each sub-frame is aggregated one sub-frame after the other, and the Coarse data for all the sub-frames is then followed by the Refinement data for the sub-frames, one after the other. Other data structures may be used, and a Header portion may include data or meta-data describing the particular type of data-structure used, as well as the length of data (number of bits or bytes) of each such Coarse or Refinement data-portion of each sub-frame of frame 400.

For demonstrative purposes, some portions of the discussion herein may relate to utilization of Reed-Solomon error correction; however, this is only a non-limiting example, and other types or methods of error correction or Forward Error Correction (FEC) may be used in accordance with the present invention.

Figure 1:
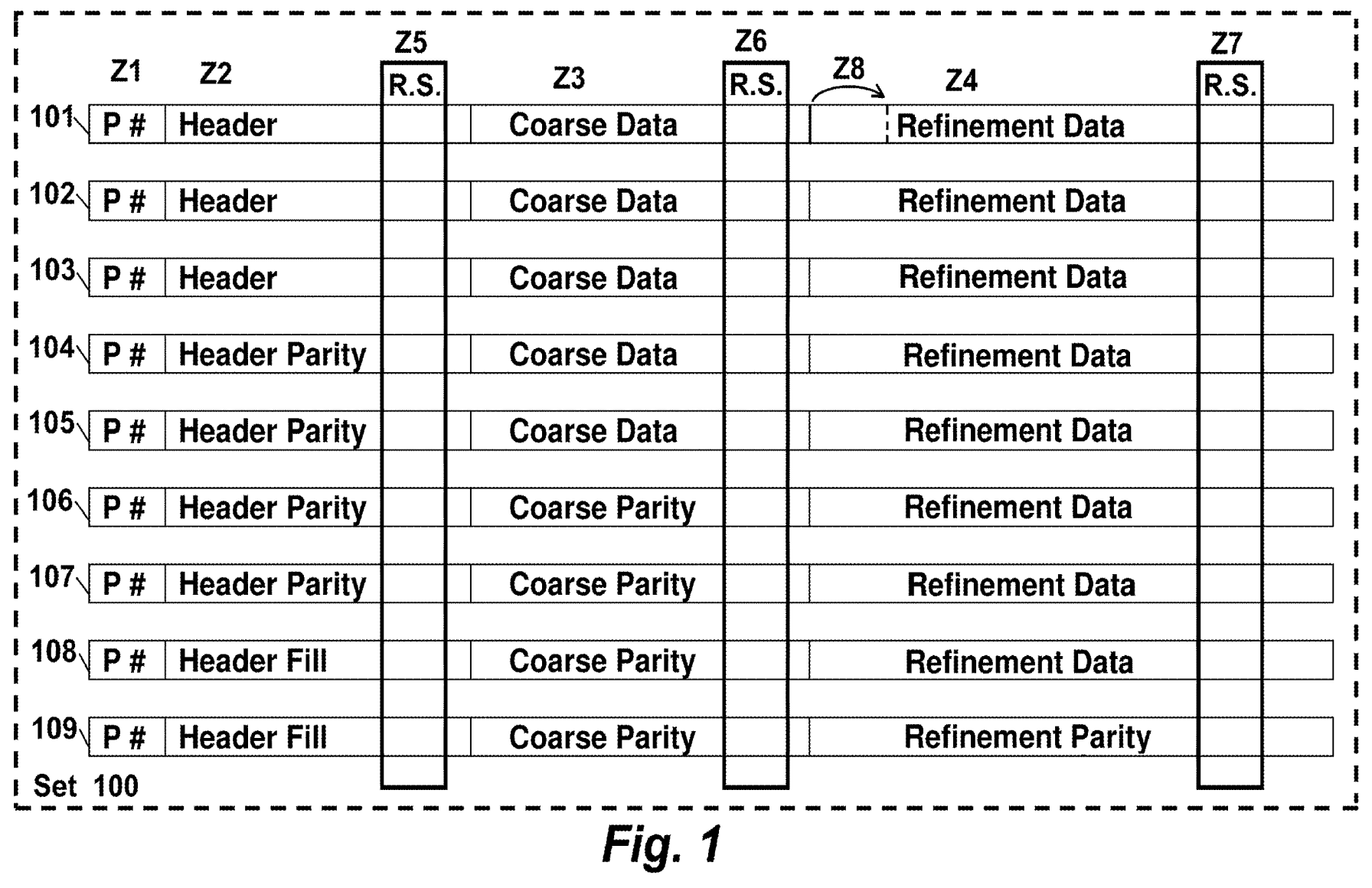

Reference is made to FIG. 1, which is a schematic illustration of a set 100 of packets of H.265 video, intended for transmission over UDP/IP, in accordance with some demonstrative embodiments of the present invention. In some embodiments, optionally, the set 100 of packets may correspond to a single Datagram that is intended for transmission over UDP/IP. In a demonstrative implementation, the set 100 comprises nine packets 101-109 that carry H.265 encoded video. An unequal error protection scheme is applied, such that the encoding entity or the transmitting entity stores and transmits, within the same packet, a suitable combination of Coarse video data and/or Refinement video data and/or Reed-Solomon error correction codes for Coarse video data and/or Reed-Solomon error corrections codes for Refinement video data.

Each packet (101 through 109) may comprise multiple packet-portions: a first packet-portion (located in the drawing under reference Z1), which is an initial packet-portion indicating a serial number of the packet (e.g., a consecutive number that wraps-around at a pre-defined upper bound); then, a Header Video packet-portion (located in the drawing under reference Z2) that stores header video information indicating meta-data about sub-frames of a video frame; then, a Coarse Data packet-portion (located in the drawing under reference Z3), which carries the coarse video data to enable the recipient device to decode and display a coarse version of transmitted frame; then, Refinement Data packet-portion (located in the drawing under reference Z4), which carries data that enable the recipient device to decode and display a refined version of the transmitted frame.

Reed-Solomon (RS) forward error correction (FEC) is used, in accordance with a particular scheme. As indicated by the elongated vertical "RS" rectangles (located in the drawing under references Z5, Z6 and Z7), the RS words (for example, each RS word comprising a systematic part, carrying the original data, and a parity/redundancy part) is encoded across multiple, corresponding, packet-portions of the same type. In accordance with the present invention, different Code Rate (or Coding Rate, or Code Ratio) or different Information Rate (or Information Ratio) are used with regard to the Coarse video data relative to the Refinement video data, and also relative to the Header data. The Code Rate may be defined as, for example, the proportion of the data-stream that is useful or non-redundant; such as, a code rate of k/n indicates that for every k bits of useful information, the system generates a greater number (n) of bits of data, such that n>k, and such that (n−k) bits are the redundant data (e.g., utilized for error correction purposes).

For example, for a particular set of nine packets 101-109, which correspond to a single video frame, there is defined a first coding rate (R1), which is the ratio of (i) the number of original (or useful, or non-redundant, or corresponding directly to actual representation of visual content) coarse video bytes in a Reed-Solomon word of the coarse video data to (ii) the total number of bytes in said Reed-Solomon word of the coarse video data. For that same set of nine packets 101-109, which correspond to that same single video frame, there is defined a second, different, coding rate (R2), which is the ratio of (I) the number of original refinement video bytes data in a Reed-Solomon word of the refinement video data to (II) the total number of bytes in said Reed-Solomon word of the refinement video data. In some embodiments, instead of or in addition to utilization of different coding rates for the Reed-Solomon words of Coarse and Refinement video data, different types of Forward Error Correction (FEC) algorithms may be used.

For example, when the number of packets per video frame is N=9, suitable values may be: first coding rate (for RS words of the Coarse video data)=R1=5/9, and for the same video frame, second coding rate (for RS words of the Refinement video data)=R2=8/9. For example, R1 is different from R2, for the same set of N packets which represent a single video frame. For example, R2 is greater than R1, for the same set of N packets which represent a single video frame. For example, the second coding rate (R2) for the RS words of the Refinement video data is at least ¾, and the first coding rate (R1) for the RS words of the Coarse video data is at most ⅔, for the same set of N packets which represent a single video frame. For example, the first coding rate R1 is in the range of 1/10 to ⅔, or is in the range of ¼ to ⅔; whereas the second coding rate R2 is in the range of ¾ to 1, or is in the range of 0.6 to 0.9. Other suitable, different, values or ranges-of-values may be used.

In a demonstrative embodiment, the set 100 of packets comprises nine packets 101-109, having a uniform packet length (e.g., in bytes; such as, a uniform packet length of 1,360 bytes or 1,400 bytes). The coarse video data is stored only in the Coarse packet-portions of the first five packets 101-105 of the set 100; whereas, the Coarse packet-portions of the next four packets 106-109 do not store Coarse video data, but instead, they store Reed-Solomon parity (or redundancy) that enables the recipient to reconstruct the Coarse video data of packets 101-105 if one or more, or some, of those packets 101-105 does not arrive to the recipient, by applying Reed-Solomon error correction to those packets of packets 101-109 that did arrive to the recipient by utilizing the additional RS parity (or at least some of it) that was contained in packets 106-109 and that did arrive to the recipient. Similarly, the refinement video data is stored only in the Refinement packet-portions of the first eight packets 101-108 of the set 100; whereas, the Refinement packet-portion of the next packet 109 does not store Refinement video data, but instead, it stores Reed-Solomon parity that enables the recipient to reconstruct the Refinement video data of packets 101-109 if one or more, or some, of those packets 101-108 does not arrive to the recipient, by applying Reed-Solomon error correction to those packets of packets 101-108 that did arrive to the recipient and by utilizing the additional RS parity (or at least some of it) that was contained in packet 109 and that did arrive to the recipient.

It would be appreciated that the coding rate of Reed-Solomon words for Coarse video data (R1, such as R1=4/9), is different from the coding rate of Reed-Solomon words for Refinement video data (R2, such as R2=8/9). The Applicants have realized that this unique scheme of different or uneven coding rates, or non-uniform coding rates, across the same set of packets of the same frame, with regard to the Coarse data portions relative to the Refinement data portions, may improve the ability of the recipient device to correctly decode the transmitted video even if one or more of the packets are lost in transit. The Applicants have realized that with regard to Coarse video data, it is more important to have a coding rate (R1) that is smaller than or equal to ⅔, or that is smaller than 0.67, or that is smaller than 0.60, or that is smaller than 0.50, or that is smaller than 0.40, or that is in the range of ⅓ to ⅔, or that is in the range of ¼ to ⅔, or that is in the range of ⅕ to ⅔; since the Coarse video data and its RS words are of primary importance in order to enable the recipient device to decode and display at least the coarse version of the transmitted video frame. In contrast, realized the Applicants, with regard to Refinement video data and its RS word, it is less important to have a relatively low coding rate, since the Refinement video data is only of secondary importance in order to enable the recipient device to decode and display the transmitted video frame, and it only operates to enable the recipient device to refine and improve the quality or the details of the already-received Coarse data. Accordingly, the second coding rate (R2) may be, for example, at least ¾, or at least ⅘, or at least ⅚, or at least 6/7, or at least ⅞, or other suitable value.

In accordance with some embodiments, a single value of R1, and a single (different, greater) value of R2, are utilized uniformly across all the sets of packets of a particular video transmission; namely, across all the various sets of UDP/IP packets that correspond to the same video transmission, or that correspond to the transmission of the same video item that is intended for delivery to the recipient device. In other words, embodiments of the present invention do not focus on constructing sets of packets, such that each set of packets has a different size (e.g., a first set of N packets, followed by a second set of M packets, such that N is different than M, for the delivery of a particular video item); but rather, embodiments of the present invention focus on constructing sets of packets having a uniform set size (e.g., uniform size of 9 packets per set, in the example shown; or uniform size of L bytes per set), such that the video item is delivered using a uniform size of sets of packets, each such set of packets utilizing the above-described scheme of non-uniform ratios R1 and R2.

Some embodiments may optionally utilize a differential or a non-uniform number of packets per video frame, as long as the system defines and/or utilizes and/or enforces an upper bound to the number of packets that is allowed to be generated per frame, such as not more than 14 packets, or not more than 15 packets, or not more than 16 packets. Accordingly, for example, when utilizing an upper limit of not more than 14 packets per video frame, a first video frame may be represented by 8 packets, and a second video frame may be represented as 14 frames, and a third video frame may be represented by 12 packets, and so forth; and no video frame would be represented by 15 or 16 or 17 packets per frame. The upper bound or the upper limit, as set by the system and/or by the transmitting entity, may be conveyed or notified to the recipient device or may be hard-coded or soft-coded at the recipient device, thereby enabling the recipient device to allocate and to utilize a limited-size buffer or memory region, while ensuring that such buffer will not overflow or underrun. For example, defining a restriction of not more than 15 packets per frame, may enable the recipient entity to define and to safely utilize a buffer that accommodates only 15 packets. In some implementations, the latency of the system may be dependent on the receiver buffer size; and therefore, restricting or limiting such size may contributed to decreasing the latency of the system.

In a demonstrative embodiment, each packet has a uniform size, such as 1,400 bytes per packet; bytes 1 through 20 of each packet carry the packet number and the Header information about sub-frames; bytes 21 through 200 of each packet carry Coarse video data; and bytes 201 through 1,400 of each packet carry Refinement video data. For the Coarse video data, the Reed-Solomon error correction may utilize, for example, Reed-Solomon words having uniform length of 9 bytes per Reed-Solomon word. For example, the Coarse video data of packets 101-105 (e.g., 5×180=960 bytes) is fed into a Reed-Solomon encoder, which generates Reed-Solomon words that span 9×180=1,620 bytes and are stored in the packet-segments that are reserved for Coarse video data in packets 106-109. Similarly, for the Refinement video data, the Reed-Solomon error correction may utilize, for example, Reed-Solomon words having uniform length of 9 bytes per Reed-Solomon word; and the Refinement video data of packets 101-108 (e.g., 8×1,200 bytes) is fed into a Reed-Solomon encoder, which generates Reed-Solomon words that span 9×1,200=10,800 bytes and are stored in the packet-segment that is reserved for Refinement video data in packet 109.

For example, the coding rate of the Coarse data is 5/9, and, as before there are a total of 960 bytes of Coarse data. However, the RS word length is 90 bytes, (e.g., 50 original bytes of data+40 bytes of redundancy data), and there are, in total, 18 (eighteen) RS words since 1620/90=18. In some embodiments, all the 40 bytes of redundancy data are located, specifically, in the last 4 packets of the set of 9 packets of the video frame, rather than being scattered across the entirety of the 9 packets of the video frame. In some embodiments, optionally, the Coarse data portion of each packet of the set of 9 packets, contains either Coarse video data or RS redundancy of Coarse video data, but not both in the same packet.

Similarly, with regard to Refinement data, at the coding rate of 8/9, all the bytes of redundancy data (RS codes) are located, specifically, in the last packet of the set of 9 packets of the video frame, rather than being scattered across the entirety of the 9 packets of the video frame. In some embodiments, optionally, each packet of the set of 9 packets, contains either Refinement video data or RS redundancy of Refinement video data, but not both in the same packet.

The Applicants have also realized that yet another, different, third coding rate (R3) may be utilized with regard to the Header information of the packets in the same set of N=9 packets or in the same UDP/IP datagram that correspond to a single video frame. For example, a single video frame may be divided into S regions or sub-frames (e.g., 24 regions, or 24 sub-frames as demonstrated in FIG. 4), each such region or sub-frame being separately encoded; and the data stored in the Header may be of high importance for the recipient device or its decoder, since the Header information may be utilized to determine which regions or sub-frames of a particular frame have arrived or are missing, or which Coarse data or Refinement data corresponds to which regions or sub-frames of particular frame(s).

Therefore, as demonstrated in set 100, the packet-portions that are reserved for Header information in packets 101 to 103, may indeed store and carry original or useful Header information that describes said information about the sub-frames of that frame; however, the packet-portions that are reserved for Header information in the next four packets (packets 104 to 107), do not store actual header information; but rather, they store instead Reed-Solomon error correction codes for the three header data-items that are stored in packets 101 to 103. For example, for the Header information, the Reed-Solomon error correction may utilize Reed-Solomon words having uniform length of 9 bytes. The header information of packets 101-103 (e.g., 3×20=60 bytes) is fed into a Reed-Solomon encoder, which generates Reed-Solomon codes that span 4×20=80 bytes; and those 80 bytes of Reed-Solomon parity data are stored and carried by the packet-segments that are reserved for Header information in packets 104-107. Accordingly, the coding rate (R3) within a single set of nine packets, may be a coding rate of 3/7, or may be other suitable value; and particularly, the third coding rate R3 is smaller than or equal to one, or is smaller than one, or is smaller than 0.90, or is smaller than 0.80, or is smaller than 0.75, or is smaller than 0.67, or is smaller than 0.60, or is smaller than 0.50.

In some embodiments, the header packet-portions of packets 108-109 may remain unused, or may be filled with null values. In other embodiments, optionally, a coding rate R3 of 3:9 may be utilized, such that three header-portions of packets 101-103 store actual Header information, whereas six header-portions of packets 104-109 store the corresponding Reed-Solomon error correction data; to thereby further increase the probability that Header information (carried in packets 101-103, and error protected in packets 104-109) would be correctly decoded at the recipient device.

Some embodiments of the present invention may utilize multiple protection mechanisms, to ensure that for each video frame, at least Coarse video, and if possible then also Refined video, would be decodable at the recipient device, even if some of the UDP/IP of the datagram of a particular frame did not arrive to the recipient device. In a demonstrative implementation, the video intended for transmission has a frame-rate of 60 frames per second (FPS); such that each frame corresponds to 1,000/60=16.67 milliseconds. The transmitting device may operate based on the assumption or the estimation, that up to nine packets would be required for encoding each frame; however, the transmitting device typically may not be able to predict that the a particular frame would require (for example) ten packets to fully carry the video data (Coarse video data, and Refinement video data, of that frame). The recipient device may operate based on the assumption or based on the configuration, that full data for a single frame should be received every 16.67 milliseconds, or approximately every 16 milliseconds. The system (transmitting device and receiving device) may thus need to utilize one or more protection mechanisms in order to guarantee low latency, even if an unexpected event occur that would require a single frame to be carried over 10 or 11 packets rather than the planned 9 packets per video frame. In such situation, the transmitting device operates to ensure that only, and exactly, 9 packets are transmitted per each video frame, carrying inside them sufficient information for correctly decoding the video frame (e.g., at least its Coarse version, and possibly also its Refined version), even if some of those nine frames are lost and do not arrive to the recipient device.

As a first protection mechanism, the size of packet-portion that is typically reserved for Coarse video data, is increased at the expense of the size of the adjacent packet-portion (of the same packet) that is typically reserve for Refinement video data; thereby enabling the frame to carry an increased amount of Coarse video data while carrying (in the same packet) a reduced amount of Refinement video data. Accordingly, as indicated in the drawing by the right-facing curved arrow under reference Z8, the vertical line in packet 101 that is the border between the Coarse Data packet-portion and the Refinement Data packet-portion, is dynamically moved (or pushed, or shifted) to the right side and would be located (for example) at the location indicated in the drawing with a dashed vertical line, representing an enlarged or an increased-size Coarse packet-portion and a reduced-size Refinement packet-portion. This reflects the greater importance to deliver at least the Coarse video data of that frame, even if such delivery is at the expense of some (or all) of the Refinement video data of that frame. Accordingly, this first protection mechanism determines that if the fixed or pre-defined number of packets per frame, does not suffice for transmitting the entirety of the Coarse video data and the entirety of the Refinement video data (and the entirety of the Reed-Solomon parity information for both of them), then the amount of space in one or more of the packets that is typically reserved or designated for carrying Coarse video data, will be re-assigned to carrying Refinement video data of that frame, at the expense of the Refinement video data of that frame.

In a second protection mechanism, the transmitting device recognizes that in the set of nine packets 101-109, the original plan or the regular plan was to utilize eight packet-portions (in packets 101-108) that are reserved for Refinement video data in order to indeed carry Refinement video data, and to utilize the Refinement video data packet-portion of the ninth packet (packet 109) for carry therein Reed-Solomon parity information for the Refinement video data of packets 101-108. However, due to the increased amount of the refinement data on one hand, and the operation of the first protection mechanism as described above on the other hand, the transmitting device recognizes that it now has a reduced size of packet-portions (in packets 101-108, or in at least one of them) for carrying Refinement video data. Therefore, as a second protection mechanism, in such situation, the Refinement video data packet-portion of the ninth packet (packet 109), is now utilized for its original purpose, namely, for carrying Refinement video data, rather than carrying Reed-Solomon parity information of Refinement video data. Accordingly, this second protection mechanism determines that if the fixed or pre-defined number of packets per frame, does not suffice for transmitting the entirety of the Refinement video data and the entirety of the Reed-Solomon parity information for the Refinement video data, then, the Refinement video data takes precedence over its Reed-Solomon parity information, and the Refinement video data would be carried in packet-portions that are otherwise designated or reserved for carrying Reed-Solomon parity information of Refinement video data.

In a third protection mechanism, if the fixed or pre-defined number of packets per frame, does not suffice for transmitting the entirety of the Coarse video data and the entirety of the Refinement video data as well as the entirety of the Reed-Solomon parity information for both of them, then: the Reed-Solomon parity information for Refinement video data is not transmitted at all in these packets of that frame; and if the discarding of the Reed-Solomon parity information of the Refinement video data still does not suffice to enable transmission of Refinement video data for that frame, then Refinement video data is discarded and is not transmitted in this set of packets for this frame: either the entirety of the Refinement video data of that frame is excluded from those nine packets and is not transmitted out for this frame, or alternatively, at least some of the Refinement video data for that frame (e.g., the Refinement video data for at least S sub-frames out of the 24 sub-frame of this frame) is excluded from those nine packets and is not transmitted for that frame. In some embodiments, the Refinement video data is arranged serially within the set of nine packets, such that (for example): firstly, the transmitting device discards or excludes from the nine packets, the Refinement video data of sub-frame 24; then, the transmitting device discards or excludes from the nine packets, the Refinement video data of sub-frame 23; and so forth; and the recipient device may still be able to receive and decode and display at least the Coarse version of those sub-frames, and may be able to receive and decode and display at least the Refined version of one or more sub-frames (of that same frame) whose Refinement video data was not excluded (e.g., the Refinement video data for sub-frames 1, 2, 3 and so forth until the cut-off point from which further Refinement video data of sub-frames was excluded).

In a fourth protection mechanism, Reed-Solomon reconstruction of missing video data—be it missing Coarse video data and/or missing Refinement video data—may still be performed at the recipient device, to thereby reconstruct one or more portions (or the entirety) of the missing Coarse video data and/or the missing Refinement video data, based on Reed-Solomon parity information that was included (if it was included) in the set of nine packets. This may be performed, for example, as long as the set of nine packets carries at least some of the Reed-Solomon parity information for the Refinement video data and/or for the Coarse video data.

In some embodiments, the recipient device or its decoder may determine that one or more UDP/IP packets of a particular frame are missing and/or did not arrive; such that for some of the subframes of that video frame, the fine video data cannot be reconstructed, while the coarse data for the same subframes can be reconstructed. In such a case, the decoder may use only the coarse data in order to reconstruct a de-compressed version of the subframes whose fine data is missing. Furthermore, for subsequent frames, the decoder may keep using the coarse video data only for the effected subframes, even if the refinement data of these subframes arrived correctly in the subsequent frames. This may be performed since in some compression standards, a P-frame cannot be decoded if the proceeding frame was not properly decoded.

Some embodiments of the present invention may utilize video headers such that each header has (or occupies) the same, constant, number of packets; whereas the video payload (Coarse video data, and Refinement video data) occupy a non-constant number of packets; and each one of these types of information (Header, Coarse video data, Refinement video data) is separately protected with its own Reed-Solomon error correction information, which is stored at the end portion of each data-type in the set of packets of that single video frame, rather than being scattered across the entirety of the packets of that single video frame.

In some embodiments, the number of packets-per-frame may vary among frames of the same video, as long as each video frame is represented by a number of packets that does not exceed a pre-defined upper bound of packets-per-frame. The upper bound may be pre-defined as, for example, up to 11 or 14 or 15 packets-per-frame. The decoder buffer would be sufficiently large to accommodate the upper bound limit of packets-per-frame, but need not be larger than that, as a larger receiver buffer may adversely affect the latency of the system. In a demonstrative implementation, the system utilizes a limit of up to 15 packets per video frame. On the recipient side, the recipient device defines and utilizes a buffer that is capable of storing up to 15 packets, and such receiver buffer need not have capacity to store 16 (or more)

packets. On the transmitter side, if the encoded data is too long, and does not fit into the constraint of 15 packets per frame, then the transmitting entity sends only the first 15 packets that were generated, and discards the remaining packets, and does not send more than 15 packets per frame; and the recipient entity would utilize one or more of the above-described protection mechanisms in order to decode or reconstruct the video frame, at least the Coarse version thereof and as much as possible also the Refined version thereof.

For example, a video encoder may generate encoded video such that the size (e.g., in bytes) of each video frame cannot be easily predicted in advance, as one encoded video frame may require 6,500 bytes whereas its immediately subsequent encoded video frame may require 8,900 bytes. The Applicants have realized that in order to achieve low latency, it may be beneficial to avoid utilization of large-size buffers. Accordingly, the system and method of the present invention may operate such that upon video encoding of each frame, a set of packet(s) is generated and is transmitted by the transmitting device, without necessarily waiting for the encoding of the next frame(s) or of any other frame(s), and/or without being dependent on the size of the currently-encoded frame or on the size of any other frame(s) (e.g., frames that were already encoded, and/or those that will be encoded).

Some embodiments may operate by defining in advance a particular, pre-defined, uniform size for the Reed-Solomon parity data; such as, in the example shown above, Coarse video parity data would occupy the Coarse packet-portions of four packets in a set of nine packets (Coarse coding rate R1=4/9), while Refinement video party data would occupy the Refinement packet-portion of one single packet in the same set of nine packets (Refinement coding rate R2=8/9), and while Header information occupies the header packet portions of seven packets with an internal division of three header-portions for actual header information and four more header-portions for Reed-Solomon error correction data of the actual header information (Header coding rate R3=3/7). The transmitting entity need not necessarily determine in advance the number of packets (per video frame) that will be used to store the actual Coarse data and/or the actual Refinement data, and this may be dynamically or selectively determined on-the-fly as frame(s) are encoded, as long as the transmitting entity does not transmit more packets per frame than a pre-defined upper bound value of packets-per-frame. Rather, the transmitting entity may notify the recipient entity, or the recipient entity may be otherwise configured to have such indication, that the Header information would always occupy a fixed size across the set of packets, such as, seven header-portions of seven packets (with the above-described Header coding rate of 3/7).

Reference is made to FIG. 2, which is a schematic illustration demonstrating frame grouping in accordance with some demonstrative embodiments of the present invention. A set 200 of three groups or three vectors is generated, in a manner that improves the robustness of H.265 video transmission over UDP/IP.

In the first group or vector 201, which may also be called "Coarse video data vector" or "Coarse video data group", the Coarse video data is accumulated for M sub-frames of a single frame. For example, with regard to a particular frame that is being encoded, and that is divided into 24 sub-frames (frame-regions), the first group 201 comprises the Coarse video data for sub-frame 1, followed by the Coarse video data for sub-frame 2, and so forth until the Coarse video data for sub-frame 24, which concludes that first group 201. It is noted that the size (e.g., in bytes) of the Coarse video data of these sub-frames is non-fixed and non-uniform, as it depends on the content that appears in each of those sub-frames (which may typically be non-identical content).

The sub-frames may be encoded in an independent manner, such that the decoding of each sub-frame is independent of the decoding of the other sub-frames (of that same video frame, an of any other sub-frame of any other video frame). This independency of decoding sub-frames may include or may utilize the feature that for inter-frame prediction, the reference image for each sub-frame, will only include the area of the same sub-frame in other frames, and will not include areas of other sub-frame(s) in other frame(s).

Similarly, in the second group or vector 202, which may also be called "Fine video data vector" or "Fine video data group", the Fine (or Refinement) video data is accumulated for sub-frames of a single frame. For example, with regard to a particular frame that is being encoded, and that is divided into 24 sub-frames (frame-regions), the second group 202 comprises the Fine video data for sub-frame 1, followed by the Fine video data for sub-frame 2, and so forth until the Fine video data for sub-frame 24, which concludes that second group 202. It is noted that the size (e.g., in bytes) of the Fine video data of these sub-frames is non-fixed and non-uniform, as it depends on the content that appears in each of those sub-frames (which may typically be non-identical content).

It is also noted that the cumulative size (e.g., in bytes) of the entirety of the first group 201 (the Coarse video data group) is different from the cumulative size (e.g., in bytes) of the entirety of the second group 202 (the Refinement video data group). Furthermore, for two different frames, the cumulative size (e.g., in bytes) of each frame, is typically different and is not fixed.

The Headers group 203 (or Headers vector), may comprise: an indication Lc(1) of the size (e.g., in bytes) of the Coarse video data of sub-frame 1 of the current frame; then, an indication Lc(2) of the size (e.g., in bytes) of the Coarse video data of sub-frame 2 of the current frame; and so forth, indications of the size (e.g., in bytes) of the Coarse data of each subsequent sub-frame of that frame (e.g., until Lc(24) which indicates the size of the Coarse data of sub-frame 24, which is the last sub-frame of a frame that consists of 24-sub-frames); and a similar aggregation of indicators for the Refinement video data, such as: an indication Lf(1) of the size (e.g., in bytes) of the Refinement video data of sub-frame 1 of the current frame; an indication Lf(2) of the size (e.g., in bytes) of the Refinement video data of sub-frame 2 of the current frame; and so forth, indications of the size (e.g., in bytes) of the Refinement data of each subsequent sub-frame of that frame (e.g., until Lf(24) which indicates the size of the Refinement data of sub-frame 24, which is the last sub-frame of a frame that consists of 24-sub-frames). Accordingly, for a frame that is divided into 24 sub-frames, the Header information may comprise the list of 48 indicators of the size (e.g., in bytes) of each Coarse video data and then Refinement video data.

With regard to the Header portion, embodiments of the present invention may utilize the following features. Firstly, the fact that a Header portion exists, wherein such Header operates as a map of the Coarse and Refinement data of transmitted sub-frames (even if some or more of the packets do not arrive to the recipient device), provides to the recipient device the ability to at least partially utilize the Refinement data that did arrive and/or the Coarse data that did arrive even if the RS decoder failed, as such Header may enable the utilization of data that did arrive and that pertains to un-affected sub-frames. Secondly, the protection that is provided to the Header portions is greater than the protection that is provided to the Refinement portions (e.g., R3<R2, or even, R3<<R2); and the protection that is provided to the Header portions is at least the same as, or better than, the protection that is provided to the Coarse portions (e.g., R3<R1, or, at most, R3=R1); and therefore, the system ensures that the crucial Header data would be decodable even if the Refinement data (or some portions thereof) is non-decodable, and possibly even if the Coarse data (or some portions thereof) is non-decodable.

In some embodiments, the Header portion may not necessarily a fixed size that is uniform for all Headers frames; but rather, the Header portion may have at least one sub-portion that has a fixed or uniform size across all headers of all packets of all frames. For example, in a demonstrative implementation, a Header portion may comprise two sub-portions: (i) a "Video-Encoder-header" sub-portion, also denoted as "VE-Header" sub-portion, which may have non-fixed or non-uniform size (e.g., around 100 bytes per video frame, or around 20 bytes per packet; but not necessarily having a fixed byte length), and which includes the information of mapping of sub-frames within the current video frame; and (ii) a "Block-header" sub-portion, also denoted as "Blk-Header" sub portion, which has a fixed or uniform size (e.g., exactly 8 bytes per video frame) across all packets and all frames, and which indicates the number of packets that belong to the current video frame. The size of the Reed-Solomon word for the Block-header sub-portion is a fixed, and therefore the number of packets on which the Block-header is transmitted is fixed; unlike the changing size of the Reed-Solomon word for the Video-Encoder-header sub-portion.

Reference is made to FIG. 3, which is a schematic illustration of a system 300, in accordance with some demonstrative embodiments of the present invention. System 300 comprises a Transmitting Device 310 able to communicate with a Recipient Device 320 over a wireless communication link, and particularly over an IP-based communication link or over a UDP/IP communication link.

Transmitting Device 310 stores or receives, or has access to, a Source Video or Input Video 310, which is intended to be transmitted and delivered to the Recipient Device 320. Transmitting Device 310 comprises a Video Encoder 311 which performs video encoding of the source/input video, for example, using HEVC or H.265 or H.264-SVC or other suitable video compression standard. Then, a Frames Grouping Unit 312 may perform grouping of frames, such that each group of frames utilizes the same single FEC word or FEC code or Reed-Solomon word. A Packetization Unit and FEC Encoder/RS Encoder 313 handles the packetization of the encoded frame data and the addition of the FEC codes or RS words. A Transmitter 314 transmits the packets to the Recipient Device 320.

At the Recipient Device 320, a Receiver 321 receives the incoming packets; not necessarily all the transmitted packets are actually received at the Receiver 321. Accordingly, a Missing UDP Packets Detector 322 operates to keep track of the arriving packets and to detect missing packets based on packet serial numbers; optionally utilizing an Erasure Vector Generator and Updater 323 which utilizes a vector representing consecutive packets, such that a value of 1 indicates a missing packet, and a value of 0 indicates a received packet. Then, a De-Packetization Unit and FEC Decoder/RS Decoder 324 operates to de-packetize the data and to perform FEC or RS decoding on the packets that did arrive. Optionally, the FEC decoder may be configured to take advantage of the erasure indication; for example, some RS decoders can correct up to floor(N−K)/2) errors when they do not receive erasure indication, but can correct up to (N−K) errors if they are given erasure indications regarding the location of these errors. A Frames Ungrouping Unit 325 ungroups a group-of-frames into discrete frames, and a Video Decoder 326 performs decoding (e.g., HEVC or H.265 or H.264-SVC decoding) of each such frame, thereby producing an Output Video 327 which may be outputted or displayed to a user via a screen or monitor or other display unit.

Each one of the units of system 300 may be implemented as a hardware component and/or software component. In some embodiments, units or devices of system 300 may comprise, or may be implemented using, other suitable components such as, for example: a processor, a Central Processing Unit (CPU), a Digital Signal Processor (DSP), a Graphics Processing Unit (GPU), a processing core, a controller, a logic unit, memory units (e.g., Random Access Memory (RAM), Flash memory), storage units (e.g., hard disk drive, solid state drive, optical drive), an input unit (e.g., keyboard, keypad, mouse, trackball, audio microphone, touch-screen), an output unit (e.g., screen, touch-screen, audio speakers), a power source (e.g., battery, power cell, connection to mains electric power), one or more wired and/or wireless transceivers (e.g., Wi-Fi transceiver, Bluetooth transceiver, cellular transceiver), a housing that holds together some or all of the components of the device, an Operating System (OS) with drivers and applications, and/or other suitable hardware components and/or software components.

In accordance with embodiments of the present invention, calculations, operations and/or determinations may be performed locally within a single device, or may be performed by or across multiple devices, or may be performed partially locally and partially remotely (e.g., at a remote server) by optionally utilizing a communication channel to exchange raw data and/or processed data and/or processing results.

Some additional embodiments of the present invention are discussed herein, and they may optionally be combined with features and/or components and/or steps of previously-discussed embodiments.

The Applicants have realized that video data may be represented as a series of still image frames. An encoder may encode the frames by storing the differences between the frames together with instructions describing the similarities between the frames. The instructions may include information associated with the differences in position of similar data between the frames which are generally due to motion. This difference is generally expressed by a motion vector and a prediction error. The encoded frames and/or the instructions are then sent by the encoder to a decoder where they may be decoded and the image frames reconstructed. Common practice is to encode the video frames using known video compression formats associated with recognized video compression standards of which one of the most popular is the ITU's H.265 standard.

Sending H.265 encoded video frames using Internet Protocol (IP) generally involves packetizing frames or sub-frames and sending the packets using User Datagram Protocol (UDP) or Transmission Control Protocol (TCP) to the encoder. UDP uses a simple connectionless communication model with a minimum of protocol mechanisms, emphasizing reduced latency and making it suitable for time-sensitive applications where dropping packets is preferable to waiting for packets delayed due to retransmission as required by TCP.

H.265 encoded video frames may be divided into three types of frames (or subframes), I-frame, B-frame, and P-frame. The I-frame is generally referred as an intra-coded frame (intra-frame) and is coded without reference to other frames. The P-frame is generally referred to as a predicted inter-coded frame (inter-frame) and is encoded with respect to past I-frames and P-frames. The B-frame is generally referred to as a bidirectional predicted inter-frame and is encoded with respect to past and future I-frames and P-frames.

There is provided, in accordance with an embodiment of the present invention, a method of transmitting video data in UDP packets including, at an encoder, encoding the video data into groups of pictures (GOPs), each GOP having a single I-frame and a plurality of P-frames and transmitting in UDP packets each frame or subframe of a GOP. The method may additionally include, at a decoder, checking reception of all of the transmitted UDP packets, and sending feedback from the decoder to the encoder responsive to reception of all of the transmitted UDP packets.

In some embodiments, the feedback may include an ACK (acknowledgement) message. Optionally, the ACK message may include an index number associated with the last received frame. In some embodiments, the method may additionally include, in each UDP packet including an index number associated with the frame or subframe being transmitted and an index number associated with the following I-frame or I-subframe to be transmitted. In some embodiments, upon receiving the ACK message, the encoder may replace the index number associated with the following I-frame or I-subframe with a new index number associated with the index number in the ACK message. Optionally, the new index number may include the number of P-frames in the plurality of P-frames. In some embodiments, the method may additionally include transmitting only P-frames or P-subframes responsive to the feedback.

There is provided, in accordance with an embodiment of the present invention, a method of packet error concealment in UDP video transmissions including, at an encoder, arranging DCT taps associated with a frame or a subframe in a zig-zag order, quantizing the DCT taps, creating a first description of the frame or subframe from the quantized DCT taps, creating a second description of the frame or subframe from the quantized DCT taps, and sending the first description and the second description in separate UDP packets to a decoder.

In some embodiments, quantizing the DCT taps may include two values Q1 and Q2 such that Q1<<Q2. In some embodiments, the first description may include Q1 for even taps and Q2 for odd taps. Alternatively, the first description may include Q1 for odd taps and Q2 for even taps.

In some embodiments, the DCT taps in the first description may be quantized around quantization points . . . , $-5$, $-3$, $-1$, $0$, $2$, $4$, $6$ . . . . In some embodiments, the DCT taps in the second description may be quantized around quantization points . . . , $-6$, $-4$, $-2$, $0$, $1$, $3$, $5$ . . . .

In some embodiments, the DCT taps in the first description may be quantized around quantization points . . . , $-9$, $-6$, $-3$, $0$, $1$, $2$, $3$ . . . . In some embodiments, the DCT taps in the second description may be quantized around quantization points . . . , $-3$, $-2$, $-1$, $0$, $3$, $6$, $9$ . . . .

In some embodiments, the method may additionally include, at the decoder, using the first description for the packet error concealment. The method may additionally include, at the decoder, using the second description for the packet error concealment. In some embodiments, the method may additionally include, at the decoder, using Maximum-Ratio-Combining (MRC) to average the quantized DCT taps in the first description with that in the second description. The averaging may include a weighted averaging.

In some embodiments, the method may additionally include, at the decoder, decoding the first description and second description around quantization points . . . , $-2$, $-1$, $0$, $1$, $2$, . . . .

In some embodiments, the second description may include only motion vectors.

In some embodiments, H.265 video data may be encoded into a group of pictures (GOP) made up from I-frames or subframes (I) and P-frames or subframes (P), for example, IPPPPIPPP . . . IPPPP. For convenience hereinafter, the term "frame" and "sub-frame" may be used interchangeably. Use of many I-frames in a GOP may be disadvantageous as it may make up for a large payload, which may even be 10 times greater than that made up by the P-frames. On the other hand, it offers the advantage of robustness as the I-frames may be decoded without the use of memory, making recovery from errors fast. Use of many P-frames, which are usually based on the previous I-frame or P-frame, may be advantageous as it may make up for a small, compact payload. Nevertheless, it has the disadvantage that error propagation may extend until the beginning of the next I-frame.

The Applicants have realized that in a GOP consisting of a single I-frame followed by multiple P-frames, the number M of P-frames selected requires a tradeoff between a large M which contributes to a low bit rate but long error propagation time, and a small M which contributes to a high bit rate but short error propagation time. Applicant has further realized that to take advantage of the low bit rate provided by a large M and the short error propagation rate provided by a small M, the GOPs may include a single I-frame (or I-subframe) followed by a relatively small number M of P-frames (or P-subframes) to prevent long error propagation time, but that, by incorporating feedback from the decoder that the packets are being successfully received, the encoder may continue to transmit P-frames without having to send I-frames.

UDP packets may not be received by the decoder and UDP does not typically employ ACK messages. Applicant has therefore introduced an ACK message to provide feedback and which may be sent from the decoder to the encoder over the application layer when all the UDP packets of each frame have been received (or when all the packets of a subframe have been received).

Each UDP packet may include information regarding the number of the current frame in the packet and may additionally include the index number of the next I-frame to be transmitted. As the ACK message may not be received by the encoder or may arrive with a certain delay, upon receipt of an ACK message, the encoder may replace the index number of the next I-frame in the UDP packets with a new index number which may include that of the last received frame for which the ACK was received and the number M of P-frames which follow the last received frame. If the encoder does not receive a new ACK message following the transmission of the M P-frames, the encoder may return to transmitting a new GOP including an I-frame.

Implementation of a method as described by the above realizations by the Applicant may provide one or more benefits or advantages, for example:

(a) As long as there are no errors, only P-frame packets may be sent;

(b) As there is no connection between download latency and upload latency, upload latency may be relatively large;

(c) The delay requirement for the upload frames is M frames which may be relatively easy to achieve;

(d) The packet error rate (PER) for the upload may be expressed by M−1/M with for example, a PER of 70% being acceptable;

(e) The error propagation may be limited to M frames, and the average error propagation to M/2 frames; and/or (f) The ratio between I-frame packets and the P-frame packets may follow the UDP PER so that, if there is a change in the UDP PER rate, the may also be a change in the I-frame to P-frame ratio.

PER is a characteristic of UDP. Forward error correction (FEC) may be used but at times it may fail, leaving as an alternative use of concealment methods based on the previous frames to make up for the lost packets. This type of concealment method may be referred to as "zero overhead concealment" as it does not require any transmission payload. However, the concealment event may be longer than one frame and may continue until the next I-frame due to error propagation, requiring that video quality be maintained at a reasonable quality during the concealment.

The Applicants have further realized that the problems associated with zero overhead concealment may be overcome by transmitting multiple descriptions of the video data in separate UDP packets. Optionally, the multiple descriptions may include two descriptions, each transmitted in a UDP packet. The decoder may then use all the transmitted packets if received, or alternatively, may use only those received packets in a method described herein below and referred to hereinafter as "small overhead concealment". Optionally, if only two descriptions are transmitted, the decoder may use the two descriptions if the two UDP packets are received or only one description if only one is received.

In a first embodiment of the present invention, the encoder may arrange the DCT taps in zig-zag order, may quantize their values Q such that Q1<<Q2, may then create two descriptions where a first description may include Q1 for the even taps and Q2 for the odd taps and where a second description may include Q1 for the odd taps and Q2 for the even taps. The two descriptions may then be sent in separate UDP packets and may be decoded by the decoder based on whether only one or both descriptions arrive. If only one description arrives, the decoder may then use that description for the small overhead concealment. If both descriptions arrive, the decoder may use Maximum-Ratio-Combining (MRC) to average, using a weighted average, the taps in the first description with that in the second description. In each description, most of the taps that were quantized in Q2 may be equal to "0", thereby occupying a small part of the packet payload. For interframe prediction, the encoder may assume that both descriptions were received by the decoder and performed MRC to generate the reference image.

In a second embodiment of the present invention, the encoder may arrange the DCT taps in zig-zag order and may create two descriptions, in the first description the quantized value Q of the DCT taps quantized around the points . . . , −5, −3, −1, 0, 2, 4, 6, . . . and that in the second description quantized around the points . . . −6, −4, −2, 0, 1, 3, 5, . . . . The two descriptions may be sent in separate UDP packets and may be decoded by the decoder based on whether only one or both descriptions arrive. If only one description arrives, the decoder may then use that description for the small overhead concealment. If both descriptions arrive, the decoder may decode the received descriptions around the quantization point with resolution . . . −2, −1, 0, 1, 2 . . . . It may be noted that the length (payload) in each description is much lower than the full description ( . . . −2, −1, 0, 1, 2 . . . ). It may be estimated that for a typical budget, when the average bit rate per tap is lower than 1.5, the length of each description may be approximately half of the full description.

In a third embodiment of the present invention, the encoder may arrange the DCT taps in zig-zag order and may create two descriptions, in the first description the quantized value Q of the DCT taps quantized around the points . . . , −9, −6, −3, 0, 1, 2, 3, . . . and that in the second description quantized around the points . . . −3, −2, −1, 0, 3, 6, 9, . . . . The two descriptions may be sent in separate UDP packets and may be decoded by the decoder based on whether only one or both descriptions arrive. If only one description arrives, the decoder may then use that description for the small overhead concealment. If both descriptions arrive, the decoder may decode the received descriptions around the quantization point with resolution . . . −2, −1, 0, 1, 2 . . . . It may be noted that the length (payload) in each description is much lower than the full description ( . . . −2, −1, 0, 1, 2 . . . ). It may be estimated that for a typical budget, when the average bit rate per tap is lower than 1.5, the length of each description may be approximately half of the full description.

In a fourth embodiment of the present invention, the encoder may create two descriptions for a P-frame. The first description may include the full description and second description may include the motion vectors (MV) without the DCT of the residuals. The two descriptions may be sent in separate UDP packets, may be decoded by the decoder based on whether only one or both descriptions arrive. If only one description arrives, the decoder may then use that description for the small overhead concealment. If the first description arrives, the decoder may use that description. If the first description does not arrive, the decoder may use the second description for the MV and may use "0" for the residuals. Optionally, as the second description is 100% overhead, the MV resolution in the second description may be lower than that in the first description to reduce the bit rate of the second description.

Figure 5:
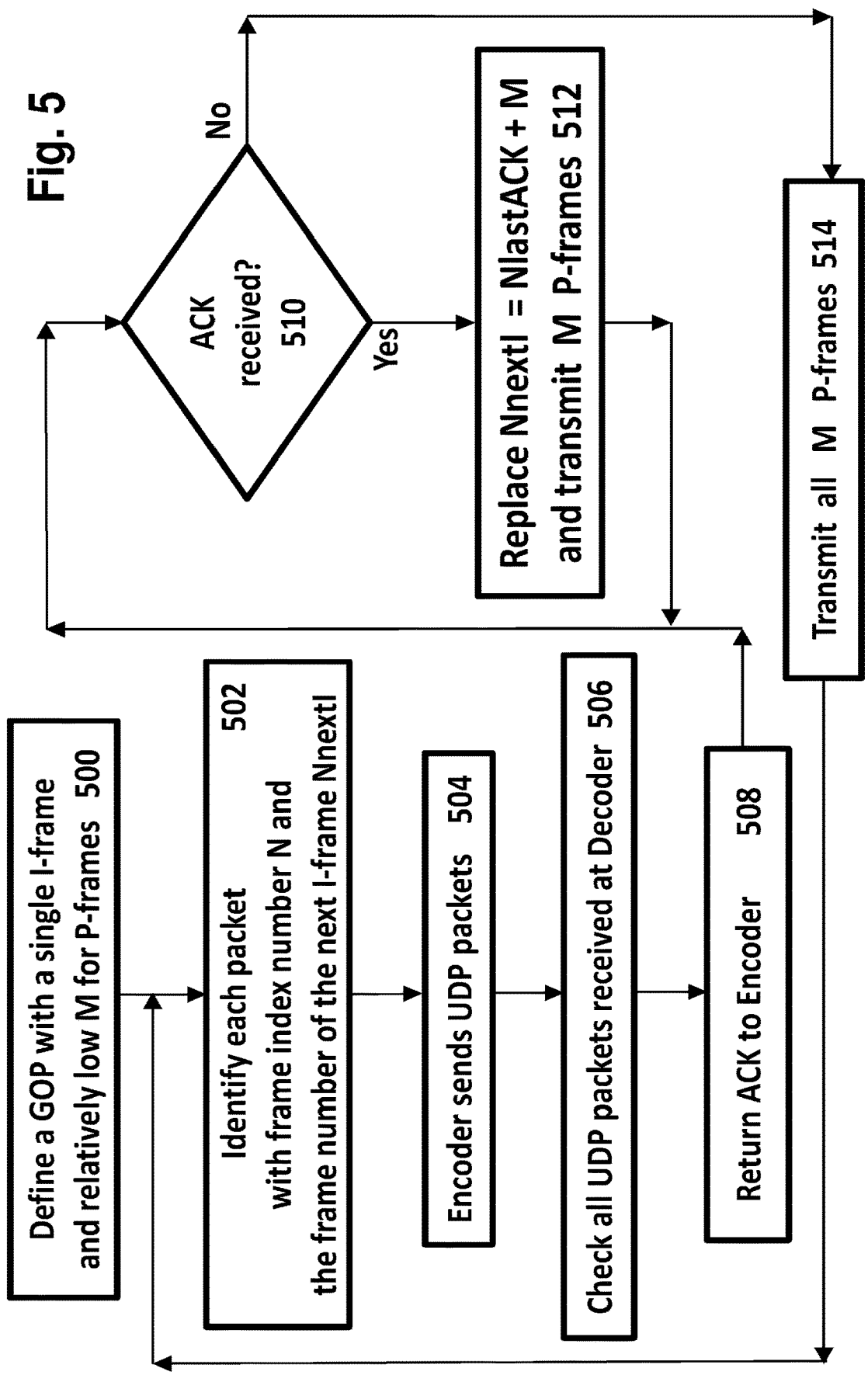
FIG. 5 is a flow chart of a method of minimizing bit rate and error propagation in video transmissions using UDP packets, in accordance with some demonstrative embodiments of the present invention.

Reference is made to FIG. 5, which is a flow chart of an exemplary method of minimizing bit rate and error propagation in video transmissions using UDP packets, in accordance with some demonstrative embodiments of the present invention. The method may be practiced with more steps or with less steps, and/or with steps optionally arranged in a different order.

At step 500, a GOP with a single I-frame (I) and multiple P-frames (P) may be encoded. Optionally, subframes may be used in lieu of whole frames (I-subframes and P-subframes). The number M of P-frames may be selected relatively low, for example, M=4, in order to avoid long propagation error. That is, using M=4 gives, GOP=IPPPP, and for 3 GOP=IPPPPIPPPPIPPPP.

At step 502, each frame (or subframe) may be packetized in UDP packets. Each packet payload may include the index number associated with the current frame (or subframe) in the payload. The payload may also include the index number associated with the next I-frame (or subframe) to be transmitted (in the following GOP).

At step 504, all the UDP packets may be sent to the decoder.

At step 506, the decoder may check that all UDP packets were received. If yes, continue to 108. If no, decoder continues to wait for new frames (or subframes).

At step 508, the decoder may send an ACK message to the encoder indicating that all packets of the frame or subframe were received.

At step 510, a check may be made at the encoder to see if the ACK message was received. If yes, continue to step 512. If no, continue to step 514.

At step 512, the encoder may replace in the packets the index number of the next I-frame (NnextI) to be transmitted with the index number (N) associated with the last frame (or subframe) received and for which the ACK message was received, plus the number 4 of P-frames which are being sent following the frame associated with the ACK message. The encoder may continue to send groups of 4 P-frames (or subframes) as long as ACK messages are being received from the decoder without sending I-frames.

At step 514, the encoder finishes to transmit the 4 P-frames. Following this, it continues to step 502. The following frame to be transmitted may be an I-frame associated with the next GOP.

Figure 6:
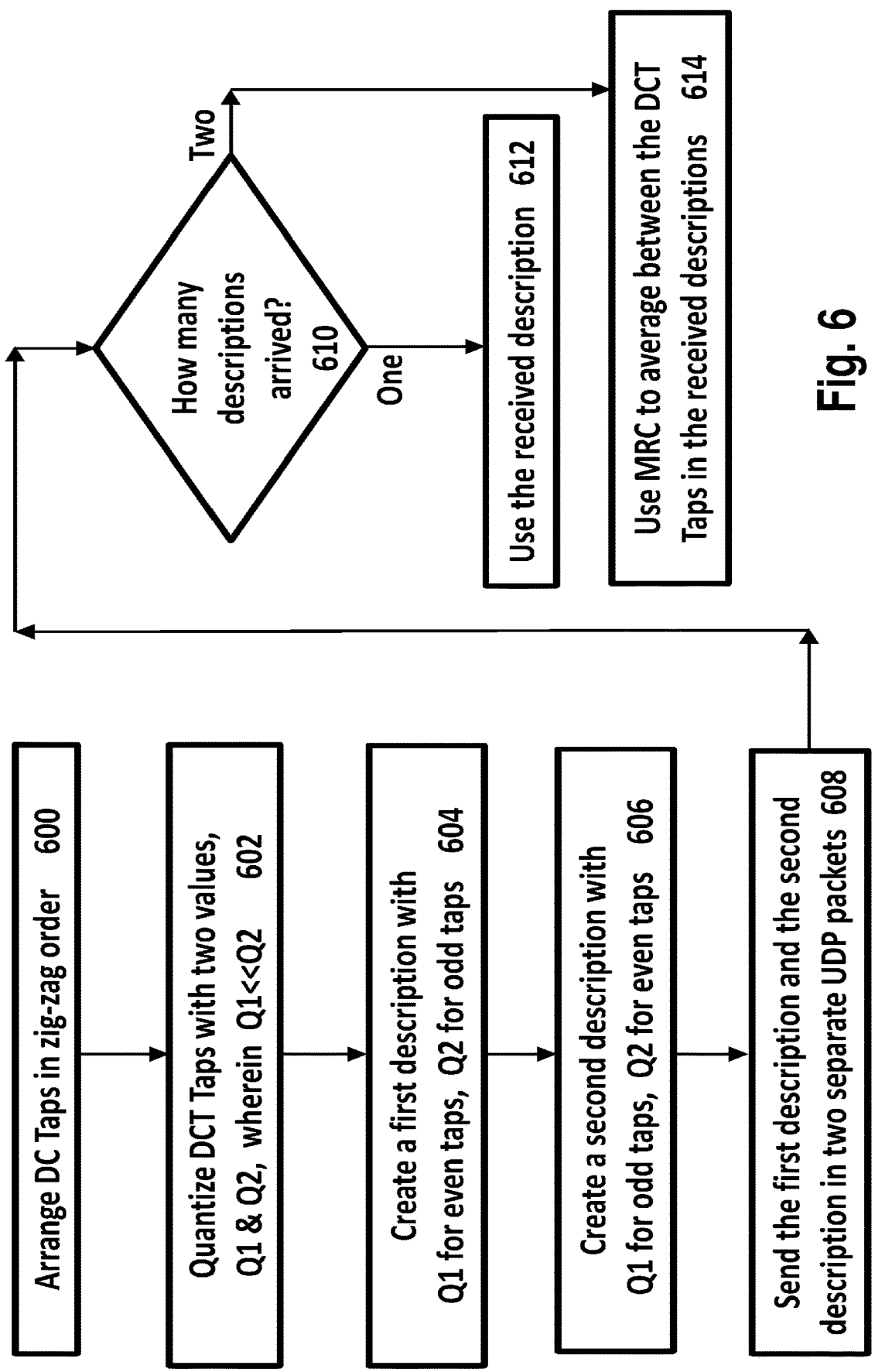
FIG. 6 is a flowchart of a method of performing small overhead concealment in video transmissions using UDP packets, in accordance with some demonstrative embodiments of the present invention.

Reference is made to FIG. 6, which is a flowchart of an exemplary method of performing small overhead concealment in video transmissions using UDP packets, in accordance with some demonstrative embodiments of the present invention. The method may be practiced with more steps or with less steps, and/or with steps optionally arranged in a different order.

At step 600, the DCT taps associated with a frame (or subframe) may be arranged by the encoder in a zig-zag order.

At step 602, the DCT taps may be quantized with two values Q1 and Q2, where Q1<<Q2. Optionally, Q2 may be a fractional integer multiple of Q1, for example, Q2=3.5× Q1.

At step 604, the encoder may create a first description of the frame (or subframe) using Q1 for the even taps and Q2 for the odd taps.

At step 606, the encoder may create a second description of the frame (or subframe) using Q1 for the odd taps and Q2 for the even taps.

At step 608, the first description and the second description may be each packetized and separately sent to a decoder in separate UDP packets.

At step 610, the decoder may check to see if the first description and the second description arrived. If only one of the descriptions arrived, then go to step 612. If both arrived, then go to step 614.

At step 612, the decoder may use the received description (first or second) to perform the small overhead concealment.

At step 614, the decoder may use both received descriptions to perform the small overhead concealment. The decoder may perform MRC to average between the DCT taps in both descriptions.

Reference is made to FIG. 7, which is a flowchart of an exemplary method of performing small overhead concealment in video transmissions using UDP packets, in accordance with some demonstrative embodiments of the present invention. The method may be practiced with more steps or with less steps, and/or with steps optionally arranged in a different order.

At step 700, the DCT taps associated with a frame (or subframe) may be arranged by the encoder in a zig-zag order.

At step 702, the decoder may create a first description of the frame (or subframe) with the DCT taps quantized around quantization points . . . , −5, −3, −1, 0, 2, 4, 6, . . . .

At step 704, the decoder may create a second description of the frame (or subframe) with the DCT taps quantized around quantization points . . . , −6, −4, −2, 0, 1, 3, 5, . . . .

At step 706, the first description and the second description may be each packetized and separately sent to a decoder in separate UDP packets.

At step 708, the decoder may check to see if the first description and the second description arrived. If only one of the descriptions arrived, then go to step 710. If both descriptions arrived, then go to step 712.

At step 710, the decoder may use the received description (first or second) to perform the small overhead concealment.

At step 712, the decoder may use both received descriptions to perform the small overhead concealment. For example, the decoder may decode around quantization points . . . , −2, −1, 0, 1, 2, . . . .

Reference is made to FIG. 8, which is a flowchart of an exemplary method of performing small overhead concealment in video transmissions using UDP packets, in accordance with some demonstrative embodiments of the present invention. The method may be practiced with more steps or with less steps, and/or with steps optionally arranged in a different order.

At step 800, the DCT taps associated with a frame (or subframe) may be arranged by the encoder in a zig-zag order.

At step 802, the decoder may create a first description of the frame (or subframe) with the DCT taps quantized around quantization points . . . , −9, −6, −3, 0, 1, 2, 3, . . . .

At step 804, the decoder may create a second description of the frame (or subframe) with the DCT taps quantized around quantization points . . . , −3, −2, −1, 0, 3, 6, 9, . . . .

At step 806, the first description and the second description may be each packetized and separately sent to a decoder in separate UDP packets.

At step 808, the decoder may check to see if the first description and the second description arrived. If only one of the descriptions arrived, then go to step 810. If both descriptions arrived, then go to step 812.

At step 810, the decoder may use the received description (first or second) to perform the small overhead concealment.

At step 812, the decoder may use both received descriptions to perform the small overhead concealment. The decoder may decode, for example, around quantization points . . . , −2, −1, 0, 1, 2, . . . .

Reference is made to FIG. 9, which is a flowchart of a fourth exemplary method of performing small overhead concealment in video transmissions using UDP packets, in accordance with some demonstrative embodiments of the present invention. The method may be practiced with more steps or with less steps, and/or with steps optionally arranged in a different order.

At step 900, the DCT taps associated with a frame (or subframe) may be arranged by the encoder in a zig-zag order.

At step 902, the decoder may create a first description of the frame (or subframe) which may be a full description of the frame.

At step 904, the decoder may create a second description of the frame (or subframe) which may include only the motion vectors (MV) and without the DCT of the residuals.

At step 906, the first description and the second description may be each packetized and separately sent to a decoder in separate UDP packets.

At step 908, the decoder may check to see if the first description arrived. If it arrived, then continue to step 910. If it did not arrive, then continue to step 912.

At step 910, the decoder may use the first description to perform the small overhead concealment.

At step 912, the decoder may use the second description to perform the small overhead concealment. The decoder may decode using the MV and using "0" for the residuals.

Some embodiments may include methods and systems for transmitting video data in UDP packets, and for packet error concealment. A method of transmitting video includes, at an encoder: encoding video data into groups of pictures (GOPs), each GOP having a single I-frame and a plurality of P-frames; and transmitting in UDP packets each frame or subframe of a GOP. The method includes, at a decoder: checking reception of all of the transmitted UDP packets, and sending feedback from the decoder to the encoder responsive to reception of all the transmitted UDP packets. A method of error concealment includes, at an encoder: arranging DCT taps associated with a frame or subframe in a zig-zag order; quantizing the DCT taps; creating a first description of the frame or subframe from the quantized DCT taps; creating a second description of the frame or subframe from the quantized DCT taps; and sending the first description and the second description in separate UDP packets to a decoder.

In some embodiments, a method of transmitting video data in UDP packets, may include: at an encoder, encoding the video data into groups of pictures (GOPs), each GOP comprising a single I-frame and a plurality of P-frames; transmitting in UDP packets each frame or subframe of a GOP; at a decoder, checking reception of all of said transmitted UDP packets; and sending feedback from said decoder to said encoder responsive to reception of all of said transmitted UDP packets. In some embodiments, said feedback comprises an acknowledgement (ACK) message.

In some embodiments, the method further comprises: including in each UDP packet, (i) an index number associated with the frame or subframe being transmitted, and (ii) an index number associated with the following I-frame or I-subframe to be transmitted.

In some embodiments, said ACK message comprises an index number associated with the last received frame.

In some embodiments, the method comprises: upon receiving said ACK message, said encoder replacing (I) said index number associated with said following I-frame or I-subframe, with (II) a new index number associated with said index number in said ACK message. In some embodiments, said new index number includes the number of P-frames in said plurality of P-frames. In some embodiments, the method comprises: transmitting only P-frames or P-subframes responsive to said feedback. Some embodiments may include a method of packet error concealment in UDP video transmissions. The method may comprises, at an encoder: arranging DCT taps associated with a frame or a subframe in a zig-zag order; quantizing said DCT taps; creating a first description of said frame or subframe from said quantized DCT taps; creating a second description of said frame or subframe from said quantized DCT taps; sending said first description and said second description in separate UDP packets to a decoder.

In some embodiments, quantizing said DCT taps comprises two values Q1 and Q2 such that Q1<<Q2. In some embodiments, said first description comprises Q1 for even taps and Q2 for odd taps. In other embodiments, said first description comprises Q1 for odd taps and Q2 for even taps.

In some embodiments, said DCT taps in said first description are quantized around quantization points . . . , −5, −3, −1, 0, 2, 4, 6 . . . . In some embodiments, said DCT taps in said second description are quantized around quantization points . . . , −6, −4, −2, 0, 1, 3, 5 . . . . In some embodiments, said DCT taps in said first description are quantized around quantization points . . . , −9, −6, −3, 0, 1, 2, 3 . . . . In some embodiments, said DCT taps in said second description are quantized around quantization points . . . , −3, −2, −1, 0, 3, 6, 9 . . . . In some embodiments, the method further comprises: at the decoder, using said first description for the packet error concealment. In some embodiments, the method further comprises: at the decoder, using said second description for the packet error concealment. In some embodiments, the method further comprises: at the decoder, using Maximum-Ratio-Combining (MRC) to average said quantized DCT taps in said first description with that in said second description. In some embodiments, said averaging comprises a weighted averaging.

In some embodiments, the method further comprises: at the decoder, decoding said first description and second description around quantization points . . . , −2, −1, 0, 1, 2, . . . .

In some embodiments, the method further comprises: including in said second description only motion vectors.

Some additional embodiments of the present invention are discussed herein, and they may optionally be combined with features and/or components and/or steps of previously-discussed embodiments.

Although portions of the discussion herein relate, for demonstrative purposes, to wired links and/or wired communications, some embodiments are not limited in this regard, but rather, may utilize wired communication and/or wireless communication; may include one or more wired and/or wireless links; may utilize one or more components of wired communication and/or wireless communication; and/or may utilize one or more methods or protocols or standards of wireless communication.

Some embodiments may be implemented by using a special-purpose machine or a specific-purpose device that is not a generic computer, or by using a non-generic computer or a non-general computer or machine. Such system or device may utilize or may comprise one or more components or units or modules that are not part of a "generic computer" and that are not part of a "general purpose computer", for example, cellular transceivers, cellular transmitter, cellular receiver, GPS unit, location-determining unit, accelerometer(s), gyroscope(s), device-orientation detectors or sensors, device-positioning detectors or sensors, or the like.

Some embodiments may be implemented as, or by utilizing, an automated method or automated process, or a machine-implemented method or process, or as a semi-automated or partially-automated method or process, or as a set of steps or operations which may be executed or performed by a computer or machine or system or other device.

Some embodiments may be implemented by using code or program code or machine-readable instructions or machine-readable code, which may be stored on a non-transitory storage medium or non-transitory storage article (e.g., a CD-ROM, a DVD-ROM, a physical memory unit, a physical storage unit), such that the program or code or instructions, when executed by a processor or a machine or a computer, cause such processor or machine or computer to perform a method or process as described herein. Such code or instructions may be or may comprise, for example, one or more of: software, a software module, an application, a program, a subroutine, instructions, an instruction set, computing code, words, values, symbols, strings, variables, source code, compiled code, interpreted code, executable code, static code, dynamic code; including (but not limited to) code or instructions in high-level programming language, low-level programming language, object-oriented programming language, visual programming language, compiled programming language, interpreted programming language, C, C++, C#, Java, JavaScript, SQL, Ruby on Rails, Go, Cobol, Fortran, ActionScript, AJAX, XML, JSON, Lisp, Eiffel, Verilog, Hardware Description Language (HDL, BASIC, Visual BASIC, Matlab, Pascal, HTML, HTML5, CSS, Perl, Python, PHP, machine language, machine code, assembly language, or the like.

Discussions herein utilizing terms such as, for example, "processing", "computing", "calculating", "determining", "establishing", "analyzing", "checking", "detecting", "measuring", or the like, may refer to operation(s) and/or process(es) of a processor, a computer, a computing platform, a computing system, or other electronic device or computing device, that may automatically and/or autonomously manipulate and/or transform data represented as physical (e.g., electronic) quantities within registers and/or accumulators and/or memory units and/or storage units into other data or that may perform other suitable operations.

The terms "plurality" and "a plurality", as used herein, include, for example, "multiple" or "two or more". For example, "a plurality of items" includes two or more items.

References to "one embodiment", "an embodiment", "demonstrative embodiment", "various embodiments", "some embodiments", and/or similar terms, may indicate that the embodiment(s) so described may optionally include a particular feature, structure, or characteristic, but not every embodiment necessarily includes the particular feature, structure, or characteristic. Furthermore, repeated use of the phrase "in one embodiment" does not necessarily refer to the same embodiment, although it may. Similarly, repeated use of the phrase "in some embodiments" does not necessarily refer to the same set or group of embodiments, although it may.

As used herein, and unless otherwise specified, the utilization of ordinal adjectives such as "first", "second", "third", "fourth", and so forth, to describe an item or an object, merely indicates that different instances of such like items or objects are being referred to; and does not intend to imply as if the items or objects so described must be in a particular given sequence, either temporally, spatially, in ranking, or in any other ordering manner.

Some embodiments may be used in, or in conjunction with, various devices and systems, for example, a Personal Computer (PC), a desktop computer, a mobile computer, a laptop computer, a notebook computer, a tablet computer, a server computer, a handheld computer, a handheld device, a Personal Digital Assistant (PDA) device, a handheld PDA device, a tablet, an on-board device, an off-board device, a hybrid device, a vehicular device, a non-vehicular device, a mobile or portable device, a consumer device, a non-mobile or non-portable device, an appliance, a wireless communication station, a wireless communication device, a wireless Access Point (AP), a wired or wireless router or gateway or switch or hub, a wired or wireless modem, a video device, an audio device, an audio-video (A/V) device, a wired or wireless network, a wireless area network, a Wireless Video Area Network (WVAN), a Local Area Network (LAN), a Wireless LAN (WLAN), a Personal Area Network (PAN), a Wireless PAN (WPAN), or the like.

Some embodiments may be used in conjunction with one way and/or two-way radio communication systems, cellular radio-telephone communication systems, a mobile phone, a cellular telephone, a wireless telephone, a Personal Communication Systems (PCS) device, a PDA or handheld device which incorporates wireless communication capabilities, a mobile or portable Global Positioning System (GPS) device, a device which incorporates a GPS receiver or transceiver or chip, a device which incorporates an RFID element or chip, a Multiple Input Multiple Output (MIMO) transceiver or device, a Single Input Multiple Output (SIMO) transceiver or device, a Multiple Input Single Output (MISO) transceiver or device, a device having one or more internal antennas and/or external antennas, Digital Video Broadcast (DVB) devices or systems, multi-standard radio devices or systems, a wired or wireless handheld device, e.g., a Smartphone, a Wireless Application Protocol (WAP) device, or the like.

Some embodiments may comprise, or may be implemented by using, an "app" or application which may be downloaded or obtained from an "app store" or "applications store", for free or for a fee, or which may be pre-installed on a computing device or electronic device, or which may be otherwise transported to and/or installed on such computing device or electronic device.

Some embodiments include a method of transmitting a video via a User Datagram Protocol (UDP) over Internet Protocol (IP) communication link. The method comprises: generating by a video encoder a set of N packets of compressed data per each frame of said video, wherein N is a natural number; upon generation of each set of N packets for a specific frame of said video, immediately performing said transmitting of said set of N packets that corresponds to a single encoded video frame, via said UDP over IP communication link, without waiting for encoding or packetization of any other video frame of said video; wherein each packet of said video frame comprises at least: (i) a Coarse video data packet-portion, and (ii) a Fine video data packet-portion.

In some embodiments, the method comprises: maintaining a fixed size (S2), in bytes, for the Coarse video data packet-portion of each packet, wherein the size (S2) is fixed throughout an entirety of said set of packets that corresponds to said single particular video frame; maintaining a fixed size (S3), in bytes, for the Fine video data packet-portion of each packet, wherein the size (S3) is fixed throughout the entirety of said set of packets that corresponds to said single particular video frame. In some embodiments, the method comprises: dynamically changing, for different frames of said video, the values of S2 and S3 that are utilized; wherein the value of S2 remains fixed across all packets of each frame of said video, but changes to a different value of S2 in at least one other frame of said video; wherein the value of S3 remains fixed across all packets of each frame of said video, but changes to a different value of S3 in at least one other frame of said video.

In some embodiments, the method comprises: dynamically increasing the size of the Coarse video data packet-portion, and dynamically reducing respectively the size of the Fine video data packet-portion, to accommodate an increased amount of Coarse video data for a specific frame at the expense of Fine video data for said specific frame.

In some embodiments, the method comprises: in a set of packets that are transmitted per video frame, designating a first number (C1) of Coarse Video data packet-portions to carry therein Coarse Video data, and designating a second number (C2) of Coarse Video data packet-portions to carry therein redundancy data for a Forward-Error-Correction (FEC) codes of said Coarse Video data, instead of carrying therein Coarse Video data.

In some embodiments, the method comprises: in a set of packets that are transmitted per video frame, designating a first number (F1) of Fine Video data packet-portions to carry therein Fine Video data, and designating a second number (F2) of Fine Video data packet-portions to carry therein redundancy data for a Forward-Error-Correction (FEC) codes of said Fine Video data, instead of carrying therein Fine Video data.

In some embodiments, the method comprises: selecting values of C1 and C2 and F1 and F2, wherein N is the total number of packets that are transmitted for a particular video frame, wherein C1+C2=N, wherein F1+F2=N, wherein F1>C1. The term "selecting", as used above and/or herein, may include, for example: defining, configuring, setting, choosing from a pre-defined list of pre-defined options, choosing based on one or more pre-defined selection rules, defining values on a per-video basis or on a per-frame basis or on other basis (e.g., per video-segment, wherein a video-segment spans T seconds, such as 10 or 30 or 60 seconds), or otherwise determining such value(s) based on one or more pre-defined criteria or conditions, or based on pre-set values.

In some embodiments, the method comprises: selecting values of N and C1 and C2 and F1 and F2, wherein N is 9, wherein C1 is 5, wherein C2 is 4, wherein F1 is 8, wherein F2 is 1.

In some embodiments, the method comprises: wherein each packet of said video frame comprises: (i) a Header packet-portion, and (ii) a Coarse video data packet-portion, and (iii) a Fine video data packet-portion; wherein the method comprises: maintaining a fixed size (S1), in bytes, for the Header packet portion of each packet in a set of packets that corresponds to a single particular video frame, wherein the size (S1) is fixed throughout an entirety of said set of packets; maintaining a fixed size (S2), in bytes, for the Coarse video data packet-portion of each packet, where the size (S2) is fixed throughout the entirety of said set of packets that corresponds to said single particular video frame; maintaining a fixed size (S3), in bytes, for the Fine video data packet-portion of each packet, wherein the size (S3) is fixed throughout the entirety of said set of packets that corresponds to said single particular video frame.

In some embodiments, each packet of said video frame comprises: (i) a Header packet-portion, and (ii) a Coarse video data packet-portion, and (iii) a Fine video data packet-portion; wherein the method comprises: dynamically changing, for different frames of said video, the values of S1 and S2 and S3 that are utilized; wherein the value of S1 remains fixed across all packets of each frame of said video, but changes to a different value of S1 in at least one other frame of said video; wherein the value of S2 remains fixed across all packets of each frame of said video, but changes to a different value of S2 in at least one other frame of said video; wherein the value of S3 remains fixed across all packets of each frame of said video, but changes to a different value of S3 in at least one other frame of said video.

In some embodiments, the method comprises: in said set of N packets of a video frame, designating a first number (H1) of Video Header data packet-portions to carry therein Video Header data, and designating a second number (H2) of Video Header data packet-portions to carry therein redundancy data for a Forward-Error-Correction (FEC) codes of said Video Header data, instead of carrying therein Video Header data.

In some embodiments, the method comprises: selecting values of N and H1 and H2 and C1 and C2 and F1 and F2, wherein C1<F1, wherein H1 is smaller than or equal to C1.

In some embodiments, the method comprises: selecting values of N and H1 and H2 and C1 and C2 and F1 and F2, wherein N is 9, wherein H1 is 3, wherein H2 is 4, wherein C1 is 5, wherein C2 is 4, wherein F1 is 8, wherein F2 is 1.

In some embodiments, the method comprises: if the number of Fine Video data packet-portions, that were designated to carry Fine Video data of a specific frame, does not suffice for carrying all the Fine Video data for said specific frame, then: storing Fine Video data of said specific frame in at least one Fine Video data packet-portion that was previously designated for storing redundancy bytes of Forward-Error-Correction (FEC) codes of Fine video data.

In some embodiments, the method comprises: if the number of Fine Video data packet-portions, that were designated to carry Fine Video data of a specific frame, does not suffice for carrying all the Fine Video data for said specific frame, then: dynamically increasing the value of F1, and dynamically decreasing respectively the value of F2.

In some embodiments, the method comprises: at a receiving device that operates to receive said video transmission, determining new values of F1 and F2 for the set of packets of a particular video frame, based on information in received Video Header portions that was received for said particular video frame.

In some embodiments, the method comprises: if the number of Coarse Video data packet-portions, that were designated to carry Coarse Video data of a specific frame, does not suffice for carrying all the Coarse Video data for said specific frame, then: storing Coarse Video data of said specific frame in at least one packet-portion that was previously designated for storing Fine Video data of said specific frame.

In some embodiments, the method comprises: at a receiving device that operates to receive said video transmission, determining new values of C1 and C2 for the set of packets of a particular video frame, based on information in received Video Header portions that was received for said particular video frame.

In some embodiments, each set of packets, that are generated for each frame of said video, utilizes a fixed ratio (R1) of (i) packet-portions designated to carry Coarse video data to (ii) packet-portions designated to carry Forward-Error-Correction (FEC) codes of Coarse video data; and also utilizes a fixed ratio (R2) of (i) packet-portions designated to carry Fine video data to (ii) packet-portions designated to carry Forward-Error-Correction (FEC) codes of Fine video data; and also utilizes a fixed ratio (R3) of (i) packet-portions designated to carry Video Header data to (ii) packet-portions designated to carry Forward-Error-Correction (FEC) codes of Video Header data.

In some embodiments, each set of N packets, that are generated for each frame of said video, comprises at least: (i) a first number (H1) of Video Header packet-portions that store Video Header information, and (ii) a second number (H2) of Video Header packet-portions that store Forward Error correction (FEC) redundancy of said Video Header video information; and further comprises, if pre-defined size constraints allow, also: (I) a first number (C1) of Coarse Video data packet-portions that store Coarse Video data, and (II) a second number (C2) of packet-portions that store Forward Error correction (FEC) redundancy for said Coarse Video data; and further comprises, if pre-defined size constraints allow, also: (III) a first number (F1) of Fine Video data packet-portions that store Fine Video data, and (IV) a second number (F2) of packet-portions that store Forward Error correction (FEC) redundancy for said Fine Video data.

In some embodiments, the method comprises: based on pre-defined byte-size constraints for said set of N packets per video frame, dynamically determining, for a specific video frame, to exclude from said set of N packets, at least some of the redundancy data for Forward-Error-Correction (FEC) codes for the Fine video data of a specific video frame.

In some embodiments, the method comprises: based on pre-defined byte-size constraints for said set of N packets per video frame, dynamically determining, for a specific video frame, to exclude from said set of N packets, (i) at least some of the redundancy data for Forward-Error-Correction (FEC) codes for the Fine video data of a specific video frame, and (ii) at least some of the Fine Video data for said specific video frame.

In some embodiments, the method comprises: based on pre-defined byte-size constraints for said set of N packets per video frame, dynamically determining, for a specific video frame, to exclude from said set of N packets, (i) an entirety of the redundancy data for Forward-Error-Correction (FEC) codes for the Fine video data of a specific video frame, and (ii) an entirety of the Fine Video data for said specific video frame.

In some embodiments, the method comprises: at a receiving device that operates to receive said video transmission, decoding one or more sub-frames of said specific video frame whose Fine video data was excluded from transmission by the transmitting device.

In some embodiments, the method comprises: at a receiving device that operates to receive said video transmission, receiving only partial and not full Fine video data for a particular video frame; if a FEC decoder of the receiving device has sufficient information to reconstruct the full Fine video data for said particular video frame, then reconstructing the full Fine video data for said particular video frame; if the FEC decoder of the receiving device does not have sufficient information to reconstruct the full Fine video data for said particular video frame, then reconstructing at least one or more Fine sub-frames of said particular video frame.

In some embodiments, the method comprises: setting an upper-bound value of Nmax packets-per-frame, that constraints transmission of each frame of said video, wherein Nmax is a natural number that is uniform for all the frames of said video, wherein compressed video data of each frame of said video is transmitted by using up to Nmax packets per frame.

In some embodiments, the method comprises: at a video encoder, generating K packets of compressed video for a particular frame of said video, wherein K is a natural number that is not necessarily fixed across all frames of said video; if K is smaller or equal to Nmax, then transmitting all K packets for said frame; if K is greater than Nmax, then: transmitting only the first Nmax packets of said K packets for said frame, and avoiding transmission of packets beyond the first Nmax packets for said frame. For example, the video encoder may generate 15 packets for a particular video frame, such that K=15; however, the maximum value of packets-per-frame may be Nmax=12; and therefore, only the first 12 packets are transmitted for that frame, such that N=12 in that set of packets for that particular frame.

In some embodiments, each packet of said set of N packets per video frame, comprises a Video Header portion that is utilized as a map of the Coarse video data and the Fine video data of transmitted sub-frames; wherein said Video Header enables a receiving device to at least partially utilize the Fine video data that arrived and/or the Coarse video data that arrived in order to decode one or more sub-frames of said video frame even if some or all of the Forward-Error-Correction (FEC) codes for said video frame were not properly decoded since too few bytes of said FEC codes arrived at said receiving device.

Functions, operations, components and/or features described herein with reference to one or more embodiments of the present invention, may be combined with, or may be utilized in combination with, one or more other functions, operations, components and/or features described herein with reference to one or more other embodiments of the present invention. The present invention may thus comprise any possible or suitable combinations, re-arrangements, assembly, re-assembly, or other utilization of some or all of the modules or functions or components that are described herein, even if they are discussed in different locations or different chapters of the above discussion, or even if they are shown across different drawings or multiple drawings.

While certain features of some demonstrative embodiments of the present invention have been illustrated and described herein, various modifications, substitutions, changes, and equivalents may occur to those skilled in the art. Accordingly, the claims are intended to cover all such modifications, substitutions, changes, and equivalents.

What is claimed is:

1. A method of transmitting a video via a User Datagram Protocol (UDP) over Internet Protocol (IP) communication link, the method comprising:
   generating by a video encoder a set of N packets of compressed data per each frame of said video, wherein N is a natural number;
   upon generation of each set of N packets for a specific frame of said video, immediately performing said transmitting of said set of N packets that corresponds to a single encoded video frame, via said UDP over IP communication link, without waiting for encoding or packetization of any other video frame of said video;
   wherein each packet of said video frame comprises at least:
   (i) a Coarse video data packet-portion, and
   (ii) a Fine video data packet-portion.

2. The method of claim 1, comprising:
   maintaining a fixed size (S2), in bytes, for the Coarse video data packet-portion of each packet, wherein the size (S2) is fixed throughout an entirety of said set of packets that corresponds to said single particular video frame;
   maintaining a fixed size (S3), in bytes, for the Fine video data packet-portion of each packet, wherein the size (S3) is fixed throughout the entirety of said set of packets that corresponds to said single particular video frame.

3. The method of claim 2, comprising:
   dynamically changing, for different frames of said video, the values of S2 and S3 that are utilized;
   wherein the value of S2 remains fixed across all packets of each frame of said video, but changes to a different value of S2 in at least one other frame of said video;
   wherein the value of S3 remains fixed across all packets of each frame of said video, but changes to a different value of S3 in at least one other frame of said video.

4. The method of claim 3, comprising:
dynamically increasing the size of the Coarse video data packet-portion, and dynamically reducing respectively the size of the Fine video data packet-portion, to accommodate an increased amount of Coarse video data for a specific frame at the expense of Fine video data for said specific frame.

5. The method of claim 4, comprising:
in a set of packets that are transmitted per video frame,
designating a first number (C1) of Coarse Video data packet-portions to carry therein Coarse Video data, and
designating a second number (C2) of Coarse Video data packet-portions to carry therein redundancy data for a Forward-Error-Correction (FEC) codes of said Coarse Video data, instead of carrying therein Coarse Video data.

6. The method of claim 5, comprising:
in a set of packets that are transmitted per video frame,
designating a first number (F1) of Fine Video data packet-portions to carry therein Fine Video data, and
designating a second number (F2) of Fine Video data packet-portions to carry therein redundancy data for a Forward-Error-Correction (FEC) codes of said Fine Video data, instead of carrying therein Fine Video data.

7. The method of claim 6, comprising:
selecting values of C1 and C2 and F1 and F2,
wherein N is the total number of packets that are transmitted for a particular video frame,
wherein C1+C2=N,
wherein F1+F2=N,
wherein F1>C1.

8. The method of claim 7, comprising:
selecting values of N and C1 and C2 and F1 and F2,
wherein N is 9,
wherein C1 is 5, wherein C2 is 4,
wherein F1 is 8, wherein F2 is 1.

9. The method of claim 1,
wherein each packet of said video frame comprises:
(i) a Header packet-portion, and
(ii) a Coarse video data packet-portion, and
(iii) a Fine video data packet-portion;
wherein the method comprises:
maintaining a fixed size (S1), in bytes, for the Header packet portion of each packet in a set of packets that corresponds to a single particular video frame, wherein the size (S1) is fixed throughout an entirety of said set of packets;
maintaining a fixed size (S2), in bytes, for the Coarse video data packet-portion of each packet, where the size (S2) is fixed throughout the entirety of said set of packets that corresponds to said single particular video frame;
maintaining a fixed size (S3), in bytes, for the Fine video data packet-portion of each packet, wherein the size (S3) is fixed throughout the entirety of said set of packets that corresponds to said single particular video frame.

10. The method of claim 1,
wherein each packet of said video frame comprises:
(i) a Header packet-portion, and
(ii) a Coarse video data packet-portion, and
(iii) a Fine video data packet-portion;
wherein the method comprises:
dynamically changing, for different frames of said video, the values of S1 and S2 and S3 that are utilized;
wherein the value of S1 remains fixed across all packets of each frame of said video, but changes to a different value of S1 in at least one other frame of said video;
wherein the value of S2 remains fixed across all packets of each frame of said video, but changes to a different value of S2 in at least one other frame of said video;
wherein the value of S3 remains fixed across all packets of each frame of said video, but changes to a different value of S3 in at least one other frame of said video.

11. The method of claim 10, comprising:
in said set of N packets of a video frame,
designating a first number (H1) of Video Header data packet-portions to carry therein Video Header data, and
designating a second number (H2) of Video Header data packet-portions to carry therein redundancy data for a Forward-Error-Correction (FEC) codes of said Video Header data, instead of carrying therein Video Header data.

12. The method of claim 11, comprising:
selecting values of N and H1 and H2 and C1 and C2 and F1 and F2,
wherein C1<F1,
wherein H1 is smaller than or equal to C1.

13. The method of claim 11, comprising:
selecting values of N and H1 and H2 and C1 and C2 and F1 and F2,
wherein N is 9,
wherein H1 is 3, wherein H2 is 4,
wherein C1 is 5, wherein C2 is 4,
wherein F1 is 8, wherein F2 is 1.

14. The method of claim 6, comprising:
if the number of Fine Video data packet-portions, that were designated to carry Fine Video data of a specific frame, does not suffice for carrying all the Fine Video data for said specific frame, then: storing Fine Video data of said specific frame in at least one Fine Video data packet-portion that was previously designated for storing redundancy bytes of Forward-Error-Correction (FEC) codes of Fine video data.

15. The method of claim 6, comprising:
if the number of Fine Video data packet-portions, that were designated to carry Fine Video data of a specific frame, does not suffice for carrying all the Fine Video data for said specific frame, then: dynamically increasing the value of F1, and dynamically decreasing respectively the value of F2.

16. The method of claim 15, comprising:
at a receiving device that operates to receive said video transmission, determining new values of F1 and F2 for the set of packets of a particular video frame, based on information in received Video Header portions that was received for said particular video frame.

17. The method of claim 5, comprising:
if the number of Coarse Video data packet-portions, that were designated to carry Coarse Video data of a specific frame, does not suffice for carrying all the Coarse Video data for said specific frame, then: storing Coarse Video data of said specific frame in at least one packet-portion that was previously designated for storing Fine Video data of said specific frame.

18. The method of claim 5, comprising:
at a receiving device that operates to receive said video transmission, determining new values of C1 and C2 for the set of packets of a particular video frame, based on information in received Video Header portions that was received for said particular video frame.

19. The method of claim 1,
wherein each set of packets, that are generated for each frame of said video,
utilizes a fixed ratio (R1) of
(i) packet-portions designated to carry Coarse video data
to
(ii) packet-portions designated to carry Forward-Error-Correction (FEC) codes of Coarse video data;
and also utilizes a fixed ratio (R2) of
(A) packet-portions designated to carry Fine video data
to
(B) packet-portions designated to carry Forward-Error-Correction (FEC) codes of Fine video data;
and also utilizes a fixed ratio (R3) of
(a) packet-portions designated to carry Video Header data
to
(b) packet-portions designated to carry Forward-Error-Correction (FEC) codes of Video Header data.

20. The method of claim 1,
wherein each set of N packets, that are generated for each frame of said video, comprises at least: (i) a first number (H1) of Video Header packet-portions that store Video Header information, and (ii) a second number (H2) of Video Header packet-portions that store Forward Error correction (FEC) redundancy of said Video Header video information;
and further comprises, if pre-defined size constraints allow, also: (I) a first number (C1) of Coarse Video data packet-portions that store Coarse Video data, and (II) a second number (C2) of packet-portions that store Forward Error correction (FEC) redundancy for said Coarse Video data;
and further comprises, if pre-defined size constraints allow, also: (III) a first number (F1) of Fine Video data packet-portions that store Fine Video data, and (IV) a second number (F2) of packet-portions that store Forward Error correction (FEC) redundancy for said Fine Video data.

21. The method of claim 20, comprising:
based on pre-defined byte-size constraints for said set of N packets per video frame,
dynamically determining, for a specific video frame, to exclude from said set of N packets, at least some of the redundancy data for Forward-Error-Correction (FEC) codes for the Fine video data of a specific video frame.

22. The method of claim 20, comprising:
based on pre-defined byte-size constraints for said set of N packets per video frame,
dynamically determining, for a specific video frame, to exclude from said set of N packets, (i) at least some of the redundancy data for Forward-Error-Correction (FEC) codes for the Fine video data of a specific video frame, and (ii) at least some of the Fine Video data for said specific video frame.

23. The method of claim 20, comprising:
based on pre-defined byte-size constraints for said set of N packets per video frame,
dynamically determining, for a specific video frame, to exclude from said set of N packets, (i) an entirety of the redundancy data for Forward-Error-Correction (FEC) codes for the Fine video data of a specific video frame, and (ii) an entirety of the Fine Video data for said specific video frame.

24. The method of claim 23, comprising:
at a receiving device that operates to receive said video transmission, decoding one or more sub-frames of said specific video frame whose Fine video data was excluded from transmission by the transmitting device.

25. The method of claim 1, comprising:
at a receiving device that operates to receive said video transmission,
receiving only partial and not full Fine video data for a particular video frame;
if a FEC decoder of the receiving device has sufficient information to reconstruct the full Fine video data for said particular video frame, then reconstructing the full Fine video data for said particular video frame;
if the FEC decoder of the receiving device does not have sufficient information to reconstruct the full Fine video data for said particular video frame, then reconstructing at least one or more Fine sub-frames of said particular video frame.

26. The method of claim 1, comprising:
setting an upper-bound value of Nmax packets-per-frame, that constraints transmission of each frame of said video,
wherein Nmax is a natural number that is uniform for all the frames of said video,
wherein compressed video data of each frame of said video is transmitted by using up to Nmax packets per frame.

27. The method of claim 26, comprising:
at a video encoder, generating K packets of compressed video for a particular frame of said video, wherein K is a natural number that is not necessarily fixed across all frames of said video;
if K is smaller or equal to Nmax, then transmitting all K packets for said frame;
if K is greater than Nmax, then: transmitting only the first Nmax packets of said K packets for said frame, and avoiding transmission of packets beyond the first Nmax packets for said frame.

28. The method of claim 1,
wherein each packet of said set of N packets per video frame, comprises a Video Header portion that is utilized as a map of the Coarse video data and the Fine video data of transmitted sub-frames;
wherein said Video Header enables a receiving device to at least partially utilize the Fine video data that arrived and/or the Coarse video data that arrived in order to decode one or more sub-frames of said video frame even if some or all of the Forward-Error-Correction (FEC) codes for said video frame were not properly decoded since too few bytes of said FEC codes arrived at said receiving device.

29. A system of transmitting a video via a User Datagram Protocol (UDP) over Internet Protocol (IP) communication link, the system comprising:
a video encoder, to generate a set of N packets of compressed data per each frame of said video, wherein N is a natural number;
a transmitter, configured to: upon generation of each set of N packets for a specific frame of said video, to immediately perform said transmitting of said set of N packets that corresponds to a single encoded video frame, via said UDP over IP communication link, without waiting for encoding or packetization of any other video frame of said video;

wherein each packet of said video frame comprises at least:
(i) a Coarse video data packet-portion, and
(ii) a Fine video data packet-portion.

* * * * *